(12) United States Patent
Kim et al.

(10) Patent No.: US 11,978,835 B2
(45) Date of Patent: May 7, 2024

(54) DISPLAY DEVICE

(71) Applicant: Samsung Display Co., LTD., Yongin-si (KR)

(72) Inventors: Hyun Kim, Seoul (KR); Jeong Su Park, Asan-si (KR); Myeong Hun Song, Pyeongtaek-si (KR); Sang Hoon Lee, Hwaseong-si (KR); Jong Chan Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 415 days.

(21) Appl. No.: 17/475,996

(22) Filed: Sep. 15, 2021

(65) Prior Publication Data

US 2022/0199870 A1 Jun. 23, 2022

(30) Foreign Application Priority Data

Dec. 18, 2020 (KR) ........................ 10-2020-0178553

(51) Int. Cl.
*H01L 33/54* (2010.01)
*H01L 25/16* (2023.01)
(Continued)

(52) U.S. Cl.
CPC ............ *H01L 33/54* (2013.01); *H01L 25/167* (2013.01); *H01L 33/38* (2013.01); *H01L 33/62* (2013.01);
(Continued)

(58) Field of Classification Search
CPC ....... H01L 25/167; H01L 33/38; H01L 33/44; H01L 33/54; H01L 33/62; H10K 59/10;
(Continued)

(56) References Cited

U.S. PATENT DOCUMENTS

| 11,211,534 B2 | 12/2021 | Bae et al. |
| 2020/0176656 A1 | 6/2020 | Bae et al. |

(Continued)

FOREIGN PATENT DOCUMENTS

| JP | 2020-521181 | 7/2020 |
| KR | 10-2020-0005711 | 1/2020 |

(Continued)

OTHER PUBLICATIONS

International Search Report corresponding to International Application No. PCT/KR2021/019094 dated Mar. 23, 2022.

(Continued)

*Primary Examiner* — Brook Kebede
(74) *Attorney, Agent, or Firm* — KILE PARK REED & HOUTTEMAN PLLC

(57) ABSTRACT

A display device includes a substrate; a first electrode and a second electrode disposed in an emission area and a sub-region and spaced apart from each other in a first direction; a first insulating layer disposed on the first electrode and the second electrode; light emitting elements disposed on the first insulating layer in the emission area, and including ends disposed on the first and second electrodes, respectively; and a second insulating layer disposed on the first insulating layer. The second insulating layer includes a fixing pattern; a support pattern portion; and a connection portion electrically connecting the fixing pattern and the support pattern portion, and the fixing pattern includes a first region that contacts an outer surface of the light emitting elements and a second region that does not contact the outer surface of the light emitting elements.

23 Claims, 19 Drawing Sheets

(51) Int. Cl.
*H01L 33/38* (2010.01)
*H01L 33/62* (2010.01)
*H01L 33/44* (2010.01)

(52) U.S. Cl.
CPC ...... *H01L 33/44* (2013.01); *H01L 2933/0016* (2013.01); *H01L 2933/005* (2013.01); *H01L 2933/0066* (2013.01)

(58) Field of Classification Search
CPC .... H10K 59/131; H10K 59/122; H10K 59/30; H10K 59/353
See application file for complete search history.

(56) References Cited

U.S. PATENT DOCUMENTS

| | | | |
|---|---|---|---|
| 2021/0057610 A1* | 2/2021 | Yang | H10K 59/353 |
| 2021/0066561 A1* | 3/2021 | Chang | H01L 33/62 |
| 2021/0202631 A1 | 7/2021 | Jo et al. | |
| 2021/0272943 A1 | 9/2021 | Lee et al. | |
| 2021/0320231 A1 | 10/2021 | Kim et al. | |
| 2021/0376281 A1 | 12/2021 | Kim et al. | |

FOREIGN PATENT DOCUMENTS

| | | |
|---|---|---|
| KR | 10-2020-0013190 | 2/2020 |
| KR | 10-2020-0013824 | 2/2020 |
| KR | 10-2020-0034896 | 4/2020 |
| KR | 10-2020-0037906 | 4/2020 |
| KR | 10-2020-0049394 | 5/2020 |
| KR | 10-2020-0068150 | 6/2020 |
| KR | 10-2020-0088961 | 7/2020 |
| KR | 10-2184724 | 12/2020 |
| KR | 10-2021-0109699 | 9/2021 |
| KR | 10-2021-0148536 | 12/2021 |

OTHER PUBLICATIONS

Written Opinion corresponding to International Application No. PCT/KR2021/019094 dated Mar. 23, 2022.

* cited by examiner

400: 410, 420
200: 210, 220
700: 710, 720

TR: ACT, GE, SD1, SD2
110: BML, VL1, VL2
120: ACT
130: GE
140: SD1, SD2, CDP1, CDP2

400: 410, 420
200: 210, 220

DISPLAY DEVICE

CROSS-REFERENCE TO RELATED APPLICATION(S)

This application claims priority to and the benefit of Korean Patent Application No. 10-2020-0178553 under 35 U.S.C. 119, filed on Dec. 18, 2020 in the Korean Intellectual Property Office (KIPO), the entire contents of which are incorporated herein by reference.

BACKGROUND

1. Technical Field

The disclosure relates to a display device.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

SUMMARY

Aspects of the disclosure provide a display device for preventing peeling off of an insulating layer disposed on light emitting elements.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, there is provided a display device comprising a substrate including an emission area and a sub-region; a first electrode and a second electrode disposed in the emission area and the sub-region on the substrate and spaced apart from each other in a first direction; a first insulating layer disposed on the first electrode and the second electrode; at least one of light emitting element disposed on the first insulating layer in the emission area, and including ends disposed on the first electrode and the second electrode, respectively; and a second insulating layer disposed on the first insulating layer. The second insulating layer may include a fixing pattern disposed on the at least one light emitting element in the emission area; a support pattern portion disposed on the first insulating layer in the sub-region; and a connection portion disposed between the fixing pattern and the support pattern portion and connecting the fixing pattern and the support pattern portion, and the fixing pattern may include a first region that contacts an outer surface of the at least one light emitting element and a second region that does not contact the outer surface of the at least one light emitting element.

A width of the fixing pattern in the first direction may be smaller than a length of the at least one light emitting element in the first direction.

The fixing pattern may expose the ends of the at least one light emitting element.

A width of the support pattern portion in the first direction may be greater than the width of the fixing pattern in the first direction.

Each of the first electrode, the second electrode, and the fixing pattern may extend in a second direction intersecting the first direction, and a length of the fixing pattern in the second direction may be greater than the width of the fixing pattern in the first direction.

The display device may further include a first bank that delimits the emission area and the sub-region. The connection portion may be disposed on the first bank disposed between the emission area and the sub-region.

The support pattern portion may be disposed on an entire surface of the sub-region and overlaps at least a part of a side surface of the first bank disposed between the emission area and the sub-region.

A height of the support pattern portion may be lower than a height of the first bank.

A bottom surface of the first region of the fixing pattern may surround the outer surface of the at least one light emitting element, and a bottom surface of the second region of the fixing pattern may face and be spaced apart from the outer surface of the at least one light emitting element.

The display device may further include a third insulating layer interposed between at least a part of the second region of the fixing pattern and the at least one light emitting element. A gap between the bottom surface of the second region of the fixing pattern and the outer surface of the at least one light emitting element may be equal to a thickness of the third insulating layer.

The display device may further include a third insulating layer disposed between the second region of the fixing pattern and the at least one light emitting element.

The second insulating layer may include an organic insulating material, and the third insulating layer may include a material different from a material included in the second insulating layer.

The third insulating layer may include an inorganic insulating material.

The fixing pattern may overlap a side surface and at least a part of a top surface of the third insulating layer, and may expose another side surface opposite to the side surface of the third insulating layer.

A width of the second region of the fixing pattern in the first direction may be greater than a width of the third insulating layer in the first direction.

The second region of the fixing pattern may include a first portion overlapping the third insulating layer and a second portion not overlapping the third insulating layer.

The another side surface of the third insulating layer may be aligned more inward than a side surface of the second region of the fixing pattern.

A width of the second region of the fixing pattern in the first direction may be equal to a width of the third insulating layer in the first direction.

A width of the second region of the fixing pattern in the first direction may be smaller than a width of the third insulating layer in the first direction.

The display device may further include a first contact electrode disposed on the first electrode and contacting the first electrode and the at least one light emitting element, and a second contact electrode disposed on the second electrode and contacting the second electrode and the at least one light emitting element. The first contact electrode and the second contact electrode may be spaced apart from each other.

The first contact electrode and the second contact electrode may be disposed in the emission area and the sub-region, and the first contact electrode and the second contact electrode may be disposed on the support pattern portion in the sub-region.

The fixing pattern may be disposed between the first contact electrode and the second contact electrode in the emission area.

At least one of the first contact electrode and the second contact electrode may be disposed on a side surface of the fixing pattern in the emission area.

A display device according to an embodiment may have a structure for preventing peeling off of a third insulating layer for fixing light emitting elements made of an organic insulating material even if the third insulating layer has a small line width compared to a length. The third insulating layer may include a fixing pattern disposed in an emission area to affix the light emitting elements, a support pattern portion disposed in a sub-region and having a width greater than that of the fixing pattern, and a connection portion disposed between the fixing pattern and the support pattern portion to connect them. The display device may have a structure for preventing peeling off of the portion disposed on the light emitting element while a subsequent step is being performed after the formation of the third insulating layer, and may prevent the light emitting element and a part of the third insulating layer from being peeled off or separated in the subsequent step, remaining as foreign materials, and deteriorating the display reliability of the display device.

Further, the display device may prevent the separation of the light emitting element due to the organic insulating material by forming a second insulating material pattern containing an inorganic insulating material on the light emitting element after the step of aligning the light emitting element and before the step of forming the third insulating layer containing the organic insulating material. On the other hand, it is possible to prevent the separation of the light emitting element due to the organic insulating material by forming the second insulating material pattern on the light emitting element such that one end of the light emitting element is completely covered and the other end of the light emitting element is exposed, and then forming the third insulating layer on the second insulating material pattern. The fixing pattern of the third insulating layer may be patterned to include a first region in contact with the light emitting element and a second region in contact with the second insulating material pattern without being in contact with the light emitting element. Even if a part of the second insulating layer is damaged in the subsequent step of removing a part of the second insulating material pattern to expose the other end of the light emitting element, the peeling off of the fixing pattern is prevented due to the contact between the first region of the third insulating layer and the light emitting element and, thus, it is possible to prevent the separation of the light emitting element.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
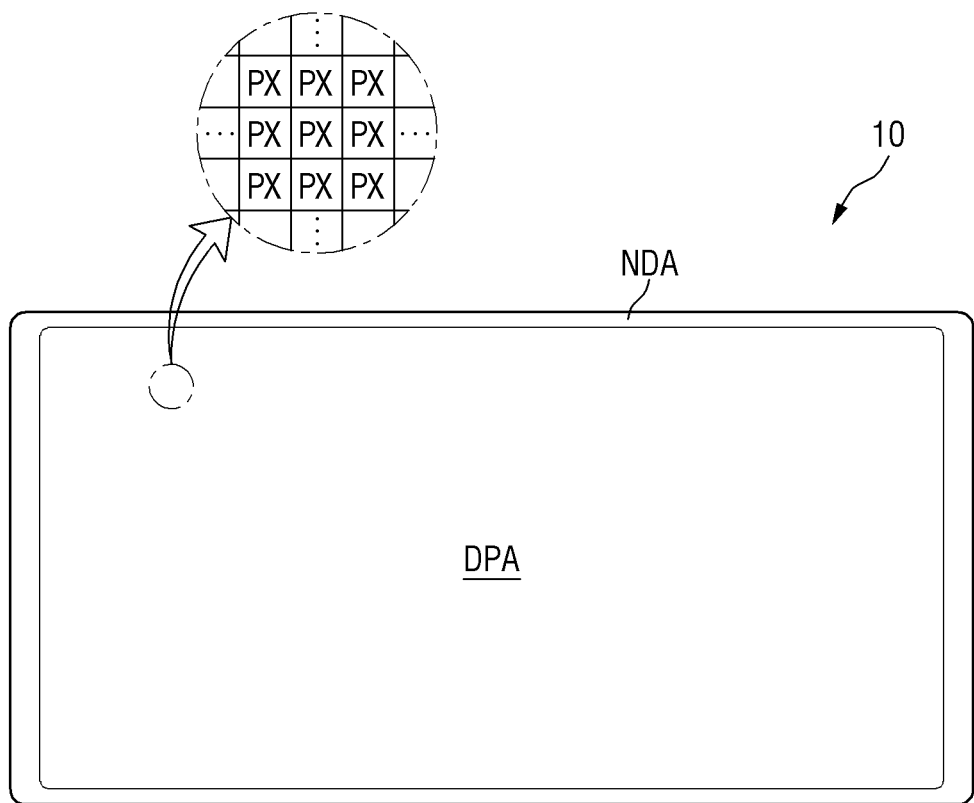
FIG. 1 is a schematic plan view of a display device according to an embodiment.
Figure 1:
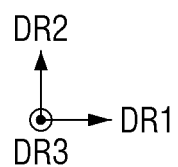

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet of things (IoT) device, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation system, a game console, a digital camera, or a camcorder, which provides a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the disclosure is not limited thereto, and other display panels may be applied within the same scope of the technical spirit.

Hereinafter, a first direction DR1, a second direction DR2, and a third direction DR3 are defined in drawings of an embodiment describing the display device 10. The first direction DR1 and the second direction DR2 may be directions perpendicular to each other in a plane. The third direction DR3 may be a direction perpendicular to a plane defined by the first direction DR1 and the second direction DR2. The third direction DR3 is perpendicular to each of the first direction DR1 and the second direction DR2. In the embodiment describing the display device 10, the third direction DR3 indicates a thickness direction (or display direction) of the display device 10.

The display device 10 may have a rectangular shape including long and short sides such that the side in the first direction DR1 is longer than the side in the second direction DR2 in a plan view. A corner portion where the long side and the short side of the display device 10 meet may be right-angled in a plan view. However, the disclosure is not limited thereto, and it may have a rounded or curved shape. The shape of the display device 10 is not limited to that illustrated in FIG. 1 and may be variously modified. For example, the display device 10 may have other shapes such as a square shape, a quadrilateral shape with rounded corners (vertices), other polygonal shapes, and a circular shape in a plan view.

A display surface of the display device 10 may be disposed on a side of the third direction DR3, which is the thickness direction. In embodiments describing the display device 10, unless otherwise noted, the term "upward" refers to a side of the third direction DR3, which is the display direction, and the term "top surface" refers to a surface toward the side of the third direction DR3. Further, the term "downward" refers to the other side of the third direction DR3, which is an opposite direction to the display direction, and the term "bottom surface" refers to a surface toward the other side of the third direction DR3. Furthermore, "left," "right," "upper," and "lower" indicate directions when the display device 10 is viewed in a plan view. For example, "right side" indicates a side of the first direction DR1, "left side" indicates the other side of the first direction DR1, "upper side" indicates a side of the second direction DR2, and "lower side" indicates the other side of the second direction DR2.

The display device 10 may include a display area DPA and a non-display area NDA. The display area DPA is an area where an image can be displayed, and the non-display area NDA is an area where no image is displayed.

The shape of the display area DPA may follow the shape of the display device 10. For example, the shape of the display area DPA may have a rectangular shape similar to the overall shape of the display device 10 in a plan view. The display area DPA may substantially occupy the center of the display device 10.

The display area DPA may include pixels PX. The pixels PX may be arranged in a matrix. The shape of each pixel PX may be a rectangular or square shape in a plan view. In an embodiment, each pixel PX may include light emitting elements including inorganic particles.

The non-display area NDA may be disposed around the display area DPA. The non-display area NDA may completely or partially surround the display area DPA. The non-display area NDA may form a bezel of the display device 10.

Figure 2:
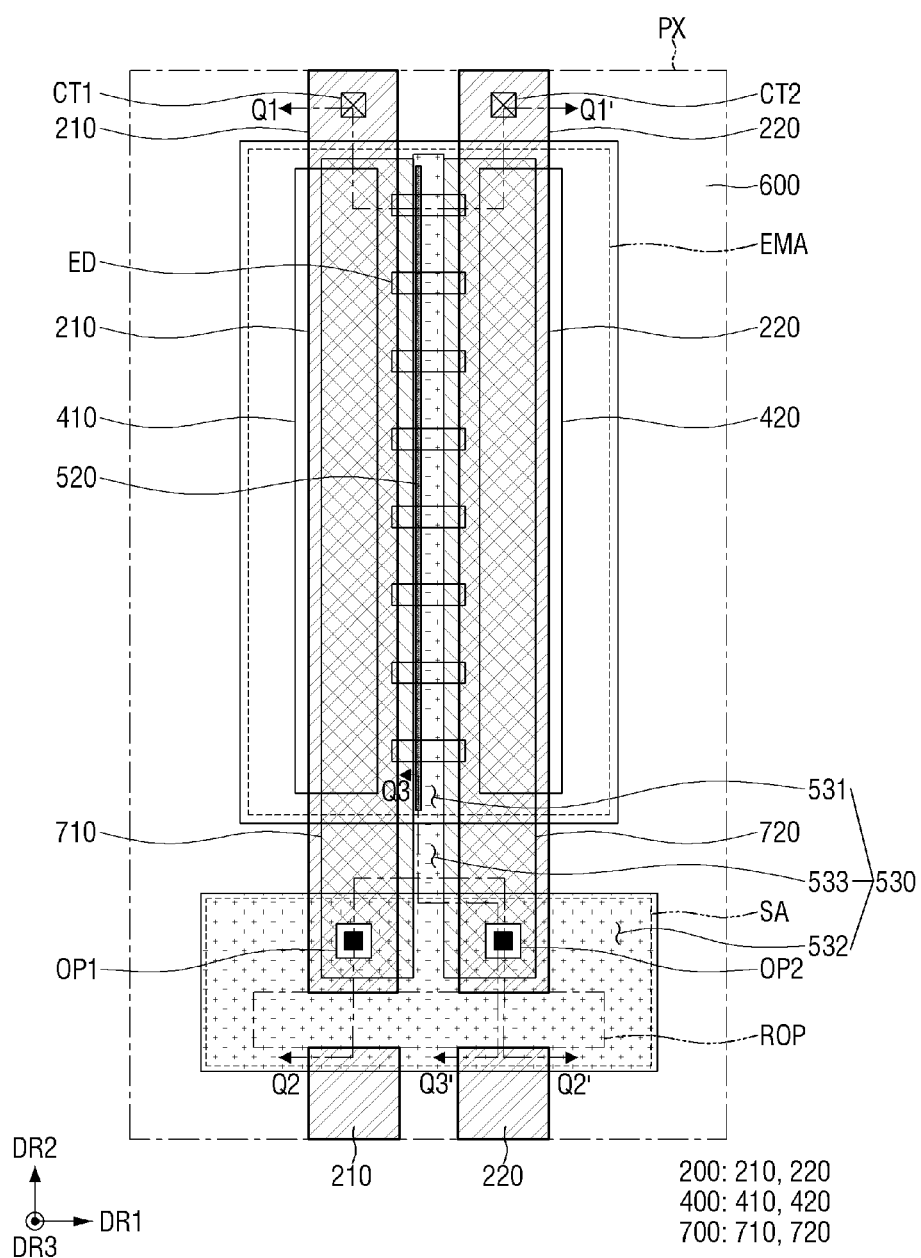
FIG. 2 is a schematic plan view illustrating one pixel of a display device according to an embodiment.

FIG. 2 is a plan view illustrating a pixel of a display device according to an embodiment.

Referring to FIG. 2, each pixel PX of the display device 10 may include an emission area EMA and a non-emission area (not shown). The emission area EMA may be defined as an area in which light emitted from a light emitting element ED is emitted, and the non-emission area may be defined as an area in which light is not emitted because the light emitted from the light emitting element ED does not reach the area.

The emission area EMA may include an area in which the light emitting element ED is disposed and an area adjacent thereto. The emission area EMA may further include a region in which the light emitted from the light emitting element ED is reflected or refracted by another member and emitted.

Each pixel PX may further include a sub-region SA disposed in the non-emission area. The light emitting element ED may not be provided in the sub-region SA. The sub-region SA may be disposed at the lower side (or the other side in the second direction DR2) from the emission area EMA within a pixel PX. The sub-region SA may be disposed between the emission areas EMA of the pixels PX disposed adjacent to each other in the second direction DR2. The sub-region SA may include a region where electrodes 200 and a contact electrode 700 are electrically connected through openings OP1 and OP2 to be described below.

The sub-region SA may include a separation portion ROP. The separation portion ROP of the sub-region SA may be a region where first electrodes 210 and second electrodes 220 of the electrodes 200 contained in pixels PX adjacent to each other in the second direction DR2 are respectively separated from each other.

Figure 3:
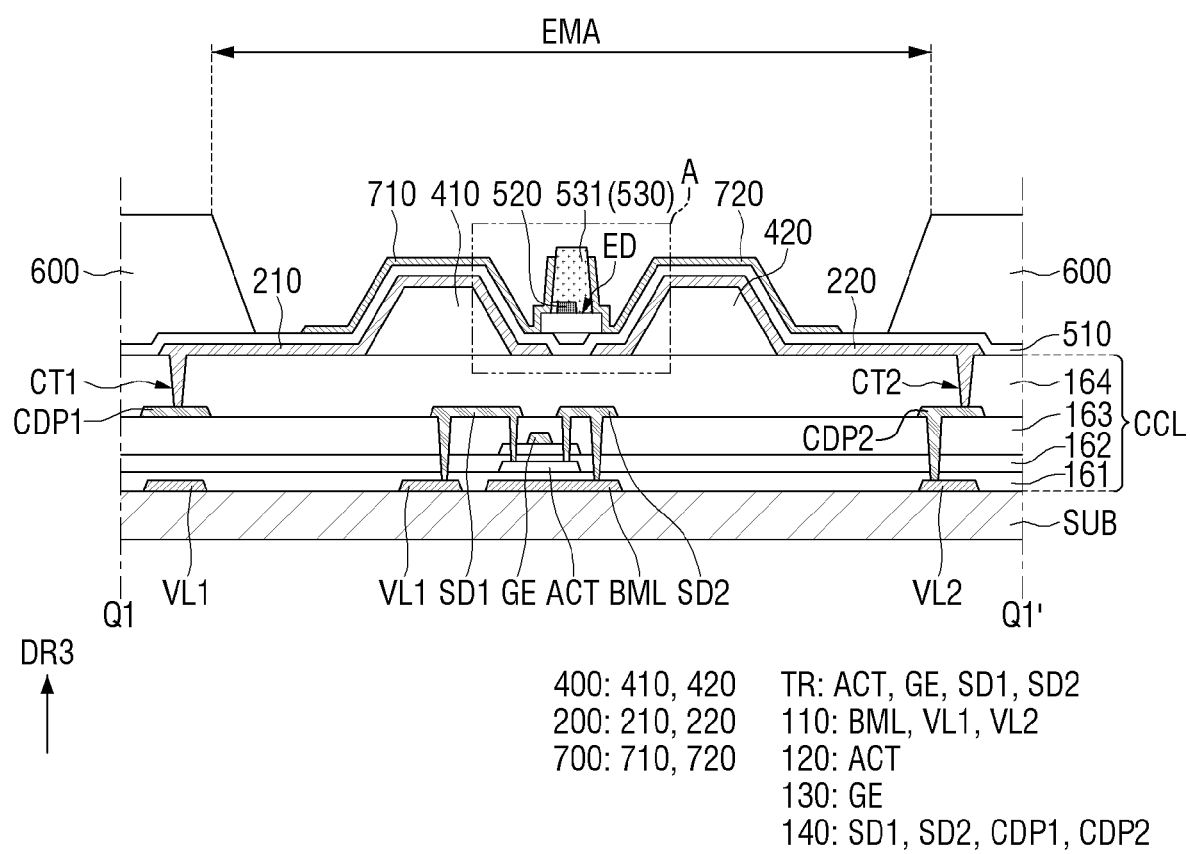
FIG. 3 is a schematic cross-sectional view taken along line Q1-Q1' of FIG. 2.

FIG. 3 is a schematic cross-sectional view taken along line Q1-Q1' of FIG. 2.

Referring to FIG. 3, the display device 10 may include a substrate SUB, a circuit element layer CCL disposed on the substrate SUB, and the light emitting elements ED disposed on the circuit element layer CCL, the electrodes 200, the contact electrode 700, and a display element layer including insulating layers.

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled.

The circuit element layer CCL may be disposed on the substrate SUB. The circuit element layer CCL may include a lower metal layer 110, a semiconductor layer 120, a first conductive layer 130, a second conductive layer 140, and insulating layers.

The lower metal layer 110 is disposed on the substrate SUB. The lower metal layer 110 may include a light blocking layer BML, a first voltage line VL1, and a second voltage line VL2.

The first voltage line VL1 may overlap at least a part of a first electrode SD1 of a transistor TR in the thickness direction of the substrate SUB. A high-potential voltage (or a first source voltage) supplied to the transistor TR may be applied to the first voltage line VL1.

The second voltage line VL2 may overlap a second conductive pattern CDP2 to be described below in the thickness direction of and the substrate SUB. A low-potential voltage (or a second source voltage) lower than the high-potential voltage supplied to the first voltage line VL1 may be applied to the second voltage line VL2. The second source voltage applied to the second voltage line VL2 may be supplied to the second electrode 220. An alignment signal for aligning the light emitting element ED during the manufacturing process of the display device 10 may be applied to the second voltage line VL2.

The high-potential voltage (or the first source voltage) supplied to the transistor TR may be applied to a first voltage line VL1, and the low-potential voltage (or the second source voltage) lower than the high-potential voltage supplied to the first voltage line VL1 may be applied to the second voltage line VL2.

The light blocking layer BML may be disposed to cover (or overlap) at least a channel region of an active layer ACT of the transistor TR from the bottom of the transistor TR and may be disposed to cover the entire active layer ACT of the transistor TR from the bottom. However, the disclosure is not limited thereto, and the light blocking layer BML may be omitted.

The lower metal layer 110 may contain a material that blocks light. For example, the lower metal layer 110 may be made of an opaque metal material that blocks transmission of light.

A buffer layer 161 may be disposed on the lower metal layer 110. The buffer layer 161 may be disposed to cover (or overlap) the entire surface of the substrate SUB where the lower metal layer 110 is disposed. The buffer layer 161 may serve to protect transistors from moisture permeating through the substrate SUB that is susceptible to moisture permeation.

The semiconductor layer 120 is disposed on the buffer layer 161. The semiconductor layer 120 may include the active layer ACT of the transistor TR. The active layer ACT of the transistor TR may be disposed to overlap the light blocking layer BML of the lower metal layer 110 as described above.

The semiconductor layer 120 may include polycrystalline silicon, monocrystalline silicon, an oxide semiconductor, or the like. In an embodiment, in case that the semiconductor layer contains polycrystalline silicon, the polycrystalline silicon may be formed by crystallizing amorphous silicon. In case that the semiconductor layer contains polycrystalline silicon, the active layer ACT of the transistor TR may include doping regions doped with impurities and channel regions disposed therebetween. In an embodiment, the semiconductor layer may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

A gate insulating layer 162 may be disposed on the semiconductor layer. The gate insulating layer 162 may function as a gate insulating layer of each transistor. The gate insulating layer 162 may be formed as a multilayer in which inorganic layers including an inorganic material, for example, at least one of silicon oxide (SiOx), silicon nitride (SiNx) and silicon oxynitride (SiOxNy), are alternately stacked.

The first conductive layer 130 may be disposed on the gate insulating layer 162. The first conductive layer 130 may include a gate electrode GE of the transistor TR. The gate electrode GE may be disposed to overlap the channel region of the active layer ACT in the third direction DR3, which is the thickness direction of the substrate SUB.

An interlayer insulating layer 163 may be disposed on the first conductive layer 130. The interlayer insulating layer 163 may be disposed to cover (or overlap) the gate electrode GE. The interlayer insulating layer 163 may function as an insulating layer between the first conductive layer 130 and other layers disposed thereon and protect the first conductive layer 130.

The second conductive layer 140 may be disposed on the interlayer insulating layer 163. The second conductive layer 140 may include the first electrode SD1 of the transistor TR, a second electrode SD2 of the transistor TR, a first conductive pattern CDP1, and the second conductive pattern CDP2.

The first electrode SD1 and the second electrode SD2 of the transistor TR may be electrically connected with both ends of the active layer ACT of the transistor TR through contact holes penetrating the interlayer insulating layer 163 and the gate insulating layer 162, respectively. Further, the first electrode SD1 of the transistor TR may be electrically connected to the first voltage line VL1 of the lower metal layer 110 through another contact hole penetrating the interlayer insulating layer 163, the gate insulating layer 162, and the buffer layer 161. The second electrode SD2 of the transistor TR may be electrically connected to the light blocking layer BML of the lower metal layer 110 through still another contact hole penetrating the interlayer insulating layer 163, the gate insulating layer 162, and the buffer layer 161.

The first conductive pattern CDP1 may be electrically connected to the second electrode SD2 of the transistor TR. The first conductive pattern CDP1 may be electrically connected to the first electrode 210 through a first electrode contact hole CT1 penetrating a via layer 164 to be described below. The transistor TR may transmit the first source voltage, applied from the first voltage line VL1, to the first electrode 210 through the first conductive pattern CDP1.

The second conductive pattern CDP2 may be electrically connected to the second voltage line VL2. The second conductive pattern CDP2 may be electrically connected to the second voltage line VL2 through the contact hole penetrating the interlayer insulating layer 163, the gate insulating layer 162, and the buffer layer 161. The second conductive pattern CDP2 may be electrically connected to the second electrode 220 through a second electrode contact hole CT2. The second conductive pattern CDP2 may transmit the second source voltage applied to the second voltage line VL2 to the second electrode 220.

Although it is illustrated in the drawing that the first conductive pattern CDP1 and the second conductive pattern CDP2 are formed in the same layer, the disclosure is not limited thereto. In some embodiments, the second conductive pattern CDP2 may be formed as a third conductive layer disposed on the second conductive layer 140 with several insulating layers interposed between the first conductive pattern CDP1 and another conductive layer, e.g., the second conductive layer 140. In this case, the first voltage line VL1 and the second voltage line VL2 may be formed not as the lower metal layer 110 but as the third conductive layer, and the first voltage line VL1 may be electrically connected to the first electrode SD1 of the transistor TR through another conductive pattern.

The via layer 164 may be disposed on the second conductive layer 140. The via layer 164 may be disposed on the interlayer insulating layer 163 where the second conductive layer 140 is disposed. The via layer 164 may include an organic insulating material, for example, an organic material such as polyimide (PI). The via layer 164 may function to flatten a surface. Although it is not illustrated in the drawing, a passivation layer for protecting the second conductive layer 140 may be further disposed on the second conductive layer 140, and the via layer 164 may be disposed on the passivation layer.

The buffer layer 161, the gate insulating layer 162, and the interlayer insulating layer 163 may be formed as inorganic layers that are alternately stacked. For example, the buffer layer 161, the gate insulating layer 162, and the interlayer insulating layer 163 may be formed as a double layer in which inorganic layers containing at least one of silicon oxide ($SiO_x$), silicon nitride ($SiN_x$), or silicon oxynitride ($SiO_xN_y$) are stacked, or as a multi-layer in which such inorganic layers are alternately stacked. However, the disclosure is not limited thereto, and the buffer layer 161, the gate insulating layer 162, and the interlayer insulating layer 163 may be formed as a single inorganic layer containing the above-described insulating material.

Figure 4:
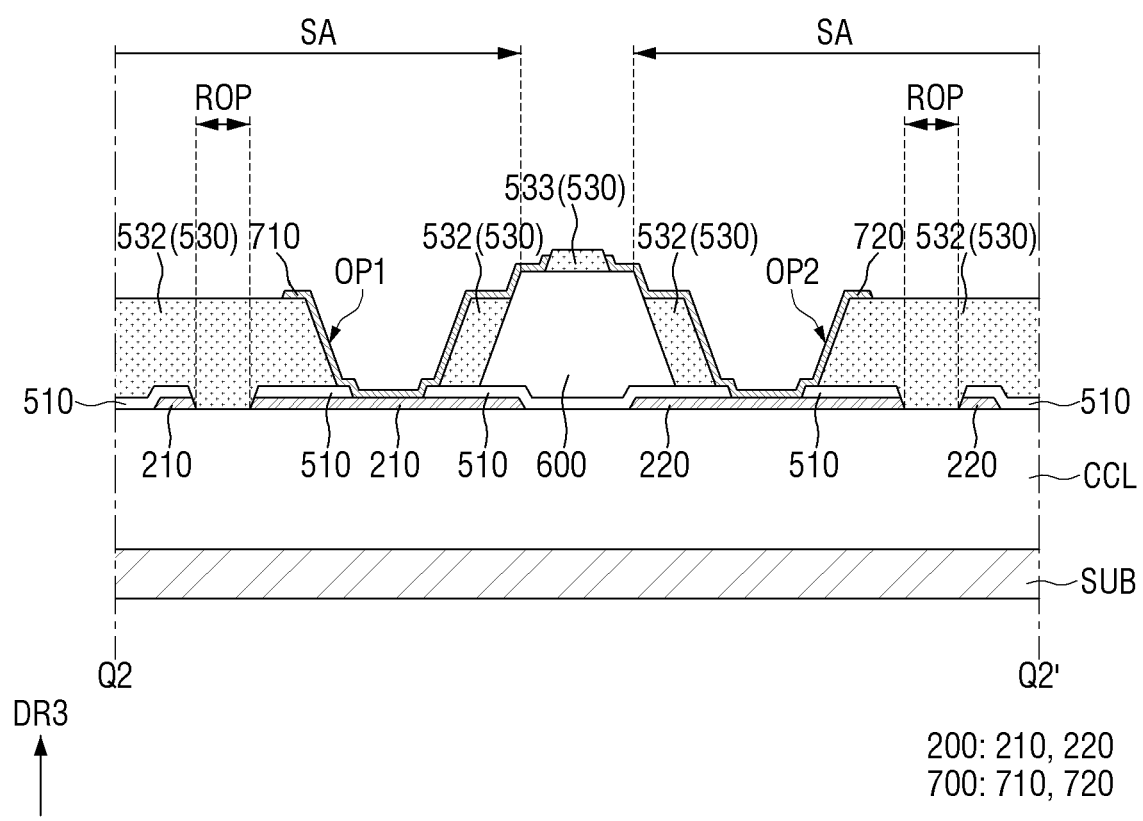
FIG. 4 is a schematic cross-sectional view taken along line Q2-Q2' of FIG. 2.
Figure 5:
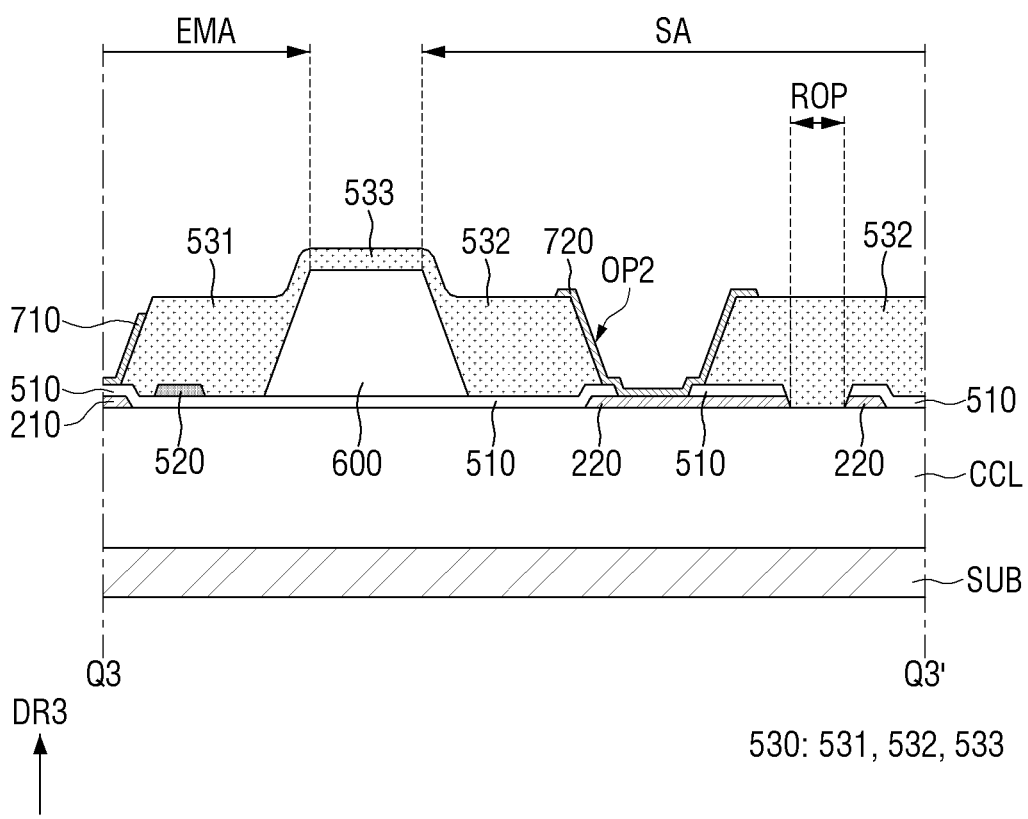
FIG. 5 is a schematic cross-sectional view taken along line Q3-Q3' of FIG. 2.

FIG. 4 is a schematic cross-sectional view taken along line Q2-Q2' of FIG. 2. FIG. 5 is a schematic cross-sectional view taken along line Q3-Q3' of FIG. 2.

Hereinafter, the structure of the display element layer disposed on the circuit element layer CCL will be described with reference to FIGS. 2 to 5.

The display element layer may be disposed on the via layer 164. The display element layer includes the electrodes 200, a first bank 400, a second bank 600, the light emitting elements ED, the contact electrode 700, and insulating layers 510, 520, and 530.

The first bank 400 is disposed on the via layer 164. The first bank 400 may be directly disposed on the via layer 164. The first bank 400 may be disposed in the emission area EMA.

The first bank 400 may extend in the second direction DR2 in the emission area EMA. The extension length of the first bank 400 in the second direction DR2 may be smaller than the length of the emission area EMA surrounded by the second bank 600 to be described below in the second direction DR2.

The first bank 400 may include sub-banks 410 and 420 spaced apart from each other in the emission area EMA. The sub-banks 410 and 420 may extend in the second direction DR2 while being spaced apart from each other in the first direction DR1. In an embodiment, the first bank 400 may include a first sub-bank 410 and a second sub-bank 420. The first sub-bank 410 may be disposed on the left side of the emission area EMA in a plan view. The second sub-bank 420 may be disposed on the right of the emission area EMA in a plan view while being spaced apart from the first sub-bank 410 in the first direction DR1. The light emitting elements ED may be arranged between the sub-banks 410 and 420 spaced apart from each other.

The first bank 400 may serve to change the traveling direction of the light emitted from the light emitting element ED toward the inclined side surface of the first bank 400 to an upward direction (e.g., a display direction). In other words, the first bank 400 may serve as a reflective partition wall that provides a space where the light emitting element ED is disposed and changes the traveling direction of the light emitted from the light emitting element ED to the display direction.

Although FIG. 3 illustrates that the side surface of the first bank 400 is inclined in a linear shape, the disclosure is not limited thereto. For example, the side surface (or outer surface) of the first bank 400 may have a curved semi-circular or semi-elliptical shape. In an embodiment, the first bank 400 may include an organic insulating material such as polyimide (PI), but the disclosure is not limited thereto.

The electrodes 200 may be arranged on the first bank 400 and the via layer 164 where the first bank 400 is exposed. The electrodes 200 may be arranged for each pixel PX while extending in a direction. The electrodes 200 may be arranged over the emission area EMA and the sub-region SA of each pixel PX while extending in the second direction DR2. The electrodes 200 may be arranged on the first bank 400 and the via layer 164 where the first bank 400 is exposed in the emission area EMA, and may be arranged on the via layer 164 in the non-emission area.

The electrodes 200 may extend in the second direction DR2 while being spaced apart from each other in the first direction DR1. The electrodes 200 may include the first electrode 210 and the second electrode 220 spaced apart from each other.

The first electrode 210 may be disposed on the first sub-bank 410 in the emission area EMA, and the second electrode 220 may be disposed on the second sub-bank 420 in the emission area EMA. The first electrode 210 and the second electrode 220 may be disposed at least on the inclined surfaces of the first sub-bank 410 and the second sub-bank 420, respectively. The first electrode 210 and the second electrode 220 may be disposed to cover (or overlap) at least one side surfaces of the first sub-bank 410 and the second sub-bank 420 facing each other to reflect the light emitted from the light emitting element ED.

The gap in the first direction DR1 between the first electrode 210 and the second electrode 220 may be smaller than the gap in the first direction DR1 between the first sub-bank 410 and the second sub-bank 420.

The electrodes 200 may be electrically connected to the second conductive layer 140 through the first electrode contact hole CT1 and the second electrode contact hole CT2 penetrating the via layer 164.

Specifically, the first electrode 210 may contact the first conductive pattern CDP1 through the first electrode contact hole CT1 penetrating the via layer 164, and the second electrode 220 may contact the second conductive pattern CDP2 through the second electrode contact hole CT2 penetrating the via layer 164. The first electrode 210 may be electrically connected to the transistor TR through the first conductive pattern CDP1. The second electrode 220 may be electrically connected to the second voltage line VL2 through the second conductive pattern CDP2, so that the second source voltage may be transmitted. Although it is illustrated in the drawing that the first electrode contact hole CT1 and the second electrode contact hole CT2 are disposed to overlap the second bank 600 in the third direction DR3, the positions of the first electrode contact hole CT1 and the second electrode contact hole CT2 are not limited thereto.

The electrodes 200 arranged in each pixel PX may extend in the second direction DR2 in a plan view while being separated from electrodes 200 of a pixel PX adjacent thereto in the second direction DR2 in the separation portion ROP of the sub-region SA. The electrodes 200 spaced apart from each other in the second direction DR2 may be arranged by extending an electrode line used in a step of aligning the of light emitting elements ED in the second direction DR2, aligning the light emitting elements ED, and separating the electrode line from the separation portion ROP of the sub-region SA by a subsequent step. The electrode line may be used for generating an electric field in the pixel PX to align the light emitting elements ED during the manufacturing process of the display device 10.

The electrodes 200 may be electrically connected to the light emitting element ED. The electrodes 200 may be electrically connected to both ends of the light emitting element ED through the contact electrode 700 to be described below, and may transmit the electric signal, applied from the second conductive layer 140, to the light emitting element ED.

Each of the electrodes 200 may include a conductive material having high reflectivity. For example, the electrodes 200 may contain, as a material having high reflectivity, a metal such as silver (Ag), copper (Cu), aluminum (Al), molybdenum (Mo), titanium (Ti), or the like, or an alloy containing aluminum (Al), nickel (Ni), lanthanum (La), or the like. The electrodes 200 may reflect the light emitted from the light emitting element ED and traveling toward the side surface of the first bank 400 in the upward direction of each pixel PX. However, the disclosure is not limited thereto, and each of the electrodes 200 may further include a transparent conductive material. For example, the electrodes 200 may include a material such as ITO, IZO, and ITZO. In some embodiments, the electrodes 200 may have a structure in which at least one transparent conductive material and at least one metal layer having high reflectivity are stacked, or may be formed as one layer including them. For example, each electrode 200 may have a stacked structure of ITO/Ag/ITO, ITO/Ag/IZO, ITO/Ag/ITZO/IZO, or the like.

The first insulating layer 510 may be disposed on the electrodes 200, the via layer 164, and the first bank 400. The first insulating layer 510 may be disposed to cover (or overlap) the via layer 164, the first bank 400, and the electrodes 200 in the emission area EMA. The first insulating layer 510 may be disposed on the electrodes 200 and the via layer 164 in the sub-region SA, but may not be disposed in the separation portion ROP of the sub-region SA.

The first insulating layer 510 may include contact portions that expose at least a part of the first electrode 210 and the second electrode 220. The contact portions may penetrate the first insulating layer 510 to form a first opening OP1 and a second opening OP2 to be described below. The contact portions penetrating the first insulating layer 510 may be disposed in the sub-region SA.

The first insulating layer 510 may serve to protect the electrodes 200 and insulate the first electrode 210 and the second electrode 220 from each other. Further, the first insulating layer 510 may prevent the light emitting elements ED to be described below that are arranged on the first insulating layer 510 from being damaged by direct contact with other members disposed therebelow. The first insulating layer 510 may include an inorganic insulating material.

The second bank 600 may be disposed on the first insulating layer 510. The second bank 600 may be disposed in the form of a grid pattern including portions extending in the first and second directions DR1 and DR2 in a plan view.

The second bank 600 may be disposed across the boundary of adjacent pixels PX to divide the pixels PX and may divide the emission area EMA and the sub-region SA of each pixel PX. Further, the second bank 600 has a height greater than that of the first bank 400 and divides the emission area EMA and the sub-region SA. Accordingly, in an inkjet printing step for aligning the light emitting elements ED during the manufacturing process of the display device 10, ink in which the light emitting elements ED are dispersed can be sprayed into the emission area EMA without being mixed with an adjacent pixel PX. The second bank 600 may include an organic insulating material, for example, polyimide (PI), but the disclosure is not limited thereto.

The light emitting elements ED may be disposed on the first insulating layer 510 in the emission area EMA. The light emitting element ED may be disposed between the first sub-bank 410 and the second sub-bank 420. The light emitting element ED may be disposed on the insulating layer 510 such that both ends thereof are located on the first electrode 210 and the second electrode 220.

The light emitting elements ED may be disposed to be spaced apart from each other in the second direction DR2 in which the first and second electrodes 210 and 220 extend, and may be aligned substantially parallel to each other. The light emitting element ED may extend in a direction, and the extension length of the light emitting element ED may be greater than the shortest gap between the first electrode 210 and the second electrode 220 spaced apart from each other in the first direction DR1. The light emitting element ED may be disposed such that at least one end thereof is located on one of the first electrode 210 and the second electrode 220 or such that both ends thereof are located on the first electrode 210 and the second electrode 210, respectively.

The second insulating layer 520 may be disposed on the light emitting element ED. The second insulating layer 520 may be disposed to partially surround the outer surface of the light emitting element ED, but not to cover (or overlap) the both the ends of the light emitting element ED. Therefore, the width of the second insulating layer 520 in the first direction DR1 may be smaller than the length of the light emitting element ED in the first direction DR1 that is the extension direction of the light emitting element ED. A portion of the second insulating layer 520 disposed on the light emitting element ED may be arranged on the first insulating layer 510 to extend in the second direction DR2 in a plan view, so that it may form a linear or island-like pattern in each pixel PX.

The second insulating layer 520 may be formed before the formation of the third insulating layer 530 to be described below in the manufacturing process of the display device 10 to protect the light emitting element ED and affix the light emitting element ED. Detailed descriptions of the second insulating layer 520 will be given below.

The third insulating layer 530 may be disposed in the emission area EMA and the non-emission area. The third insulating layer 530 may be disposed across the emission area EMA and the sub-region SA.

In an embodiment, the third insulating layer 530 may include a fixing pattern 531, a support pattern portion 532, and a first connection portion 533.

The fixing pattern 531 may be disposed in the emission area EMA. The fixing pattern 531 may extend in the second direction DR2 in the emission area EMA in a plan view. The length of the fixing pattern 531 in the second direction DR2 may be greater than the width of the fixing pattern 531 in the first direction DR1.

The fixing pattern 531 may be disposed on the light emitting element ED and the second insulating layer 520 in the emission area EMA. The fixing pattern 531 may be disposed to surround the second insulating layer 520 and a part of the outer surface of the light emitting element ED where the second insulating layer 520 is exposed. The fixing pattern 531 may expose both ends of the light emitting element ED.

At least a part of the fixing pattern 531 may contact the outer surface of the light emitting element ED, and another part of the fixing pattern 531 may be spaced apart from the outer surface of the light emitting element ED with a space interposed therebetween without contacting the outer surface of the light emitting element ED. The second insulating layer 520 may be disposed in a space between the fixing pattern 531 and the light emitting element ED.

The fixing pattern 531 may be disposed to cover (or overlap) at least a part of the top surface and a side surface of the second insulating layer 520. The fixing pattern 531 may expose another side surface opposite to the side surface of the second insulating layer 520. The width of the fixing pattern 531 in the first direction DR1 may be greater than the width of the second insulating layer 520 in the first direction DR1. The thickness of the fixing pattern 531 may be greater than the thickness of the second insulating layer 520.

The fixing pattern 531 may be disposed on the light emitting element ED such that at least a part of the fixing pattern 531 partially surrounds the outer surface of the light emitting element ED, and thus may serve to protect the light emitting element ED and affix the light emitting element ED during the manufacturing process of the display device 10, together with the second insulating layer 520. Further, the fixing pattern 531 may be disposed to fill the space between the light emitting element ED and the first insulating layer 510 disposed therebelow.

The support pattern portion 532 may be disposed in the sub-region SA. The support pattern portion 532 may be disposed in the entire sub-region SA. The support pattern portion 532 may be disposed in the entire separation portion ROP of the sub-region SA. The support pattern portion 532 may be disposed to cover (or overlap) the first insulating layer 510 in the sub-region SA.

The support pattern portion 532 may be disposed to cover (or overlap) at least a part of the side surface of the second bank 600 that delimits the sub-region SA in the sub-region SA. Specifically, the support pattern portion 532 may be disposed on the side surface of the second bank 600 disposed between the sub-region SA and the emission area EMA.

The height of the support pattern portion 532 may be smaller than the height of the second bank 600. The height of the support pattern portion 532 and the height of the second bank 600 may be measured from a reference surface such as a surface of the substrate SUB. The support pattern portion 532 may be disposed on the side surface of the second bank 600 such that the height of the support pattern portion 532 is smaller than the height of the second bank 600, and thus may reduce or minimize a step (or height difference) between the sub-region SA and the second bank 600 disposed between the emission area EMA and the sub-region SA. The support pattern portion 532 may be disposed to cover (or overlap) the side surface of the second bank 600 disposed between the emission area EMA and the sub-region SA, so that it is possible to minimize (or reduce) a step between the top surface of the uppermost member in an area between the emission area EMA and the sub-region SA and the top surface of the uppermost member in the sub-region SA. Therefore, the step between the regions in a pixel PX may be reduced, and the contact electrode 700 extending from the emission area EMA to the sub-region SA may be prevented from being electrically disconnected due to the step in the second bank 600.

The width of the support pattern portion 532 in the first direction DR1 may be greater than the width of the fixing pattern 531 in the first direction DR1. Further, the area of the support pattern portion 532 in a plan view may be greater than that of the fixing pattern 531 in a plan view. Since the area of the support pattern portion 532 is greater than that of the fixing pattern 531, the fixing pattern 531 is prevented from being peeled off or separated in a subsequent step, which makes it possible to stably affix the light emitting element ED to the first insulating layer 510. In other words, the support pattern portion 532 may prevent the fixing pattern 531 from being separated or peeled off from the light emitting element ED in the manufacturing process of the display device 10.

The support pattern portion 532 may include the first opening OP1 and the second opening OP2 that expose the first electrode 210 and the second electrode 220, respectively. The first opening OP1 and the second opening OP2 penetrating the support pattern portion 532 may expose a part of the top surfaces of the first electrode 210 and the second electrode 220, respectively. In an embodiment, the first opening OP1 and the second opening OP2 may be disposed in the sub-region SA. The contact electrode 700 to be described below and the first and second electrodes 210 and 220 may contact each other through the first opening OP1 and the second opening OP2 that expose a part of the top surfaces of the first electrode 210 and the second electrode 220, respectively, while penetrating the support pattern portion 532.

The first connection portion 533 may be disposed between the fixing pattern 531 and the support pattern portion 532. The first connection portion 533 may be disposed in the non-emission area between the emission area EMA and the sub-region SA. The first connection portion 533 may be disposed on the second bank 600 disposed between the emission area EMA and the sub-region SA. The first connection portion 533 may be disposed to cover (or overlap) the top surface and the side surface of the second bank 600 that divide the emission area EMA and the sub-region SA.

The first connection portion 533 may serve to connect the fixing pattern 531 and the support pattern portion 532. In other words, the fixing pattern 531, the support pattern portion 532, and the first connection portion 533 may be integral with each other and be formed as a pattern. Although the fixing pattern 531, the support pattern portion 532, and the first connection portion 533 of the third insulating layer 530 are divided based on the positions and the connection relationship with other members, they may be formed in the same step to form (or constitute) a third insulating layer 530. In an embodiment, the third insulating layer 530 may include an organic insulating material.

The contact electrode 700 may be disposed on the electrodes 210 and 220, the light emitting element ED, and the third insulating layer 530. The contact electrode 700 may be partially disposed on the side surface of the fixing pattern 531 of the third insulating layer 530 in the emission area EMA. The contact electrode 700 may be disposed on the support pattern portion 532 of the third insulating layer 530 in the sub-region SA.

The contact electrode 700 may be disposed for each pixel PX while extending in a direction. The contact electrode 700 may be disposed across the emission area EMA and sub-region SA of each pixel PX while extending in the second direction DR2.

The contact electrode 700 may extend in the second direction DR2 and may include a first contact electrode 710 and a second contact electrode 720 spaced apart from each other in the first direction DR1.

The first contact electrode 710 may be disposed on the first electrode 210. The first contact electrode 710 may extend in the second direction DR2. The first contact electrode 710 may contact the first electrode 210 and an end of the light emitting element ED. Specifically, the first contact electrode 710 may contact an end of the light emitting element ED where the second insulating layer 520 and the fixing pattern 531 are exposed in the emission area EMA. Further, the first contact electrode 710 may contact the first electrode 210 exposed by the first opening OP1 penetrating the first insulating layer 510 and the support pattern portion 532 of the third insulating layer 530 in the sub-region SA. The first contact electrode 710 may serve to electrically connect the end of the light emitting element ED to the first electrode 210.

The second contact electrode 720 may be disposed on the second electrode 220. The second contact electrode 720 may extend in the second direction DR2. The second contact electrode 720 may contact the second electrode 220 and another end of the light emitting element ED. Specifically, the second contact electrode 720 may contact the other end of the light emitting element ED that is exposed by the second insulating layer 520 and the fixing pattern 531 in the emission area EMA. Further, the second contact electrode 720 may contact the second electrode 220 exposed by the second opening OP2 penetrating the first insulating layer 510 and the support pattern portion 532 of the third insulating layer 530 in the sub-region SA. The second contact electrode 720 may serve to electrically connect the other end of the light emitting element ED to the second electrode 220.

The end of the light emitting element ED exposed by the second insulating layer 520 and the fixing pattern 531 of the third insulating layer 530 may be electrically connected to the first electrode 210 through the first contact electrode 710, and the other end thereof may be electrically connected to the second electrode 220 through the second contact electrode 720.

The first contact electrode 710 and the second contact electrode 720 may be spaced apart from each other with the fixing pattern 531 of the third insulating layer 530 interposed therebetween in the emission area EMA. In the emission area EMA, a part of at least one of the first contact electrode 710 and the second contact electrode 720 may be disposed on the side surface of the fixing pattern 531. The height of the portions of the first contact electrode 710 and the second contact electrode 720 that are disposed on the side surface of the fixing pattern 531 may be smaller than the height of the fixing pattern 531. Therefore, the first contact electrode 710 and the second contact electrode 720 may not be disposed on the top surface of the fixing pattern 531.

On the other hand, although it is illustrated in the drawing that the first contact electrode 710 and the second contact electrode 720 are disposed on substantially the same layer, the disclosure is not limited thereto. For example, the first contact electrode 710 and the second contact electrode 720 may be disposed on different layers, and another insulating layer may be disposed therebetween.

The contact electrode 700 may include a conductive material. For example, the contact electrode 700 may include ITO, IZO, ITZO, aluminum (Al), or the like. In an example, the contact electrode 700 may contain a transparent conductive material, and the light emitted from the light emitting element ED may travel toward the electrodes 200 while passing through the contact electrode 700 and be reflected from the outer surfaces of multiple electrodes 200.

Although it is not illustrated in the drawing, an insulating layer may be further disposed on the third insulating layer 530, the contact electrode 700, and the second bank 600. The insulating layer may function to protect the members disposed on the substrate SUB from the external environment.

Figure 6:
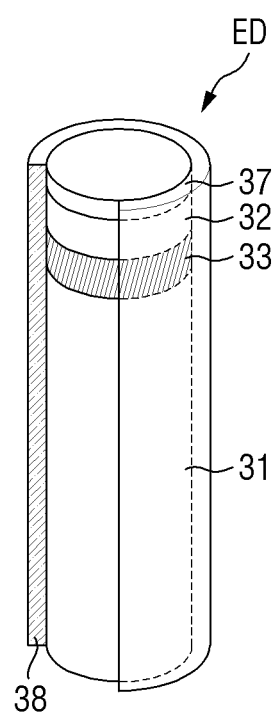
FIG. 6 is a schematic perspective view of a light emitting element according to an embodiment.

FIG. 6 is a schematic view of a light emitting element according to an embodiment.

Referring to FIG. 6, the light emitting element ED may be a particulate element and may have a rod or cylindrical shape having a predetermined aspect ratio. The length of the light emitting element ED may be greater than the diameter of the light emitting element ED, and the aspect ratio may be about 6:5 to about 100:1, but the disclosure is not limited thereto.

The light emitting element ED may have a size of a nanometer scale (equal to or greater than 1 nm and less than 1 μm) to a micrometer scale (equal to or greater than 1 μm and less than 1 mm). In an embodiment, both the diameter and the length of the light emitting element ED may have a size of a nanometer scale or a micrometer scale. In some other embodiments, the diameter of the light emitting element ED may have a size of a nanometer scale, while the length of the light emitting element ED may have a size of a micrometer scale. In some embodiments, some of the light emitting elements ED may have a diameter and/or length having a size of a nanometer scale, while some others of the light emitting elements ED may have a diameter and/or length having a size of a micrometer scale.

In an embodiment, the light emitting element ED may be an inorganic light emitting diode. The inorganic light emitting diode may include semiconductor layers. For example, the inorganic light emitting diode may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled to emit light.

In an embodiment, the above-described semiconductor layers may be sequentially stacked in the longitudinal direction of the light emitting element ED. As shown in FIG. 6, the light emitting element ED may include a first semiconductor layer 31, an element active layer 33, and a second semiconductor layer 32 that are sequentially stacked in the longitudinal direction. The first semiconductor layer 31, the element active layer 33, and the second semiconductor layer 32 may be the first conductive semiconductor layer, the active semiconductor layer, and the second conductive semiconductor layer described above, respectively.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductive dopant such as Mg, Zn, Ca, Se, Ba, or the like. In an embodiment, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In some embodiments, the element active layer 33 may have a structure in which semiconductor materials having large band gap energy and semiconductor materials having small band gap energy are alternately stacked, and may include other group III to V semiconductor materials according to the wavelength band of the emitted light.

The light emitted from the element active layer 33 may be projected through both side surfaces as well as the outer surface of the light emitting element ED in the longitudinal direction. For example, the directionality of light emitted from the element active layer 33 is not limited to a direction.

The light emitting element ED may further include an element electrode layer 37 disposed on the second semiconductor layer 32. The element electrode layer 37 may contact the second semiconductor layer 32. The element electrode layer 37 may be an ohmic contact electrode. However, the element electrode layer 37 is not limited thereto, and may be a Schottky contact electrode.

In case that both ends of the light emitting element ED are electrically connected to the contact electrodes 700 to apply an electrical signal to the first and second semiconductor layers 31 and 32, the element electrode layer 37 may be disposed between the second semiconductor layer 32 and the electrode to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include a semiconductor material doped with an n-type or p-type dopant.

The light emitting element ED may further include an element insulating layer 38 surrounding the outer peripheral surfaces of the first semiconductor layer 31, the second semiconductor layer 32, and the element active layer 33, and/or the element electrode layer 37. The element insulating layer 38 may be disposed to surround at least the outer surface of the element active layer 33 and may extend in a direction in which the light emitting element ED extends. The element insulating layer 38 may function to protect the members. Since the element insulating layer 38 is made of materials having insulating properties, it is possible to prevent an electrical short circuit that may occur in case that the element active layer 33 directly contacts an electrode through which an electric signal is transmitted to the light emitting element ED. Further, since the element insulating layer 38 includes the element active layer 33 to protect the outer peripheral surfaces of the first and second semiconductor layers 31 and 32, it is possible to prevent degradation in light emission efficiency.

Figure 7A:
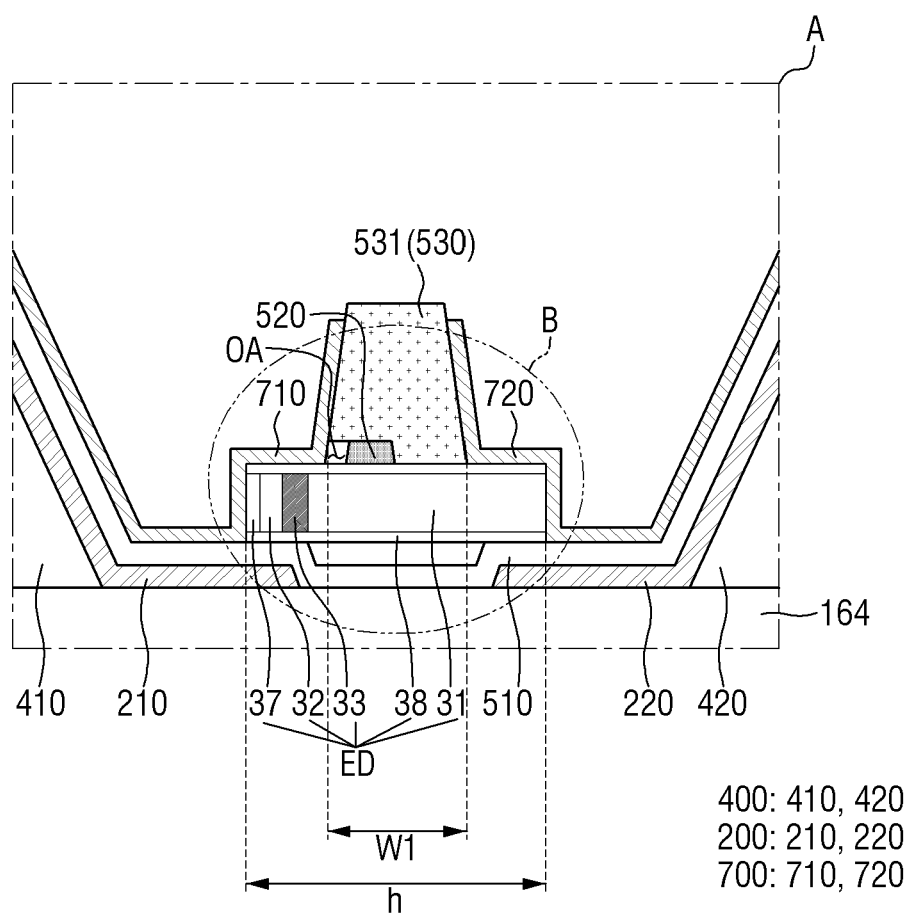
FIG. 7A is an enlarged cross-sectional view schematically illustrating an example of area A of FIG. 3.
Figure 7B:
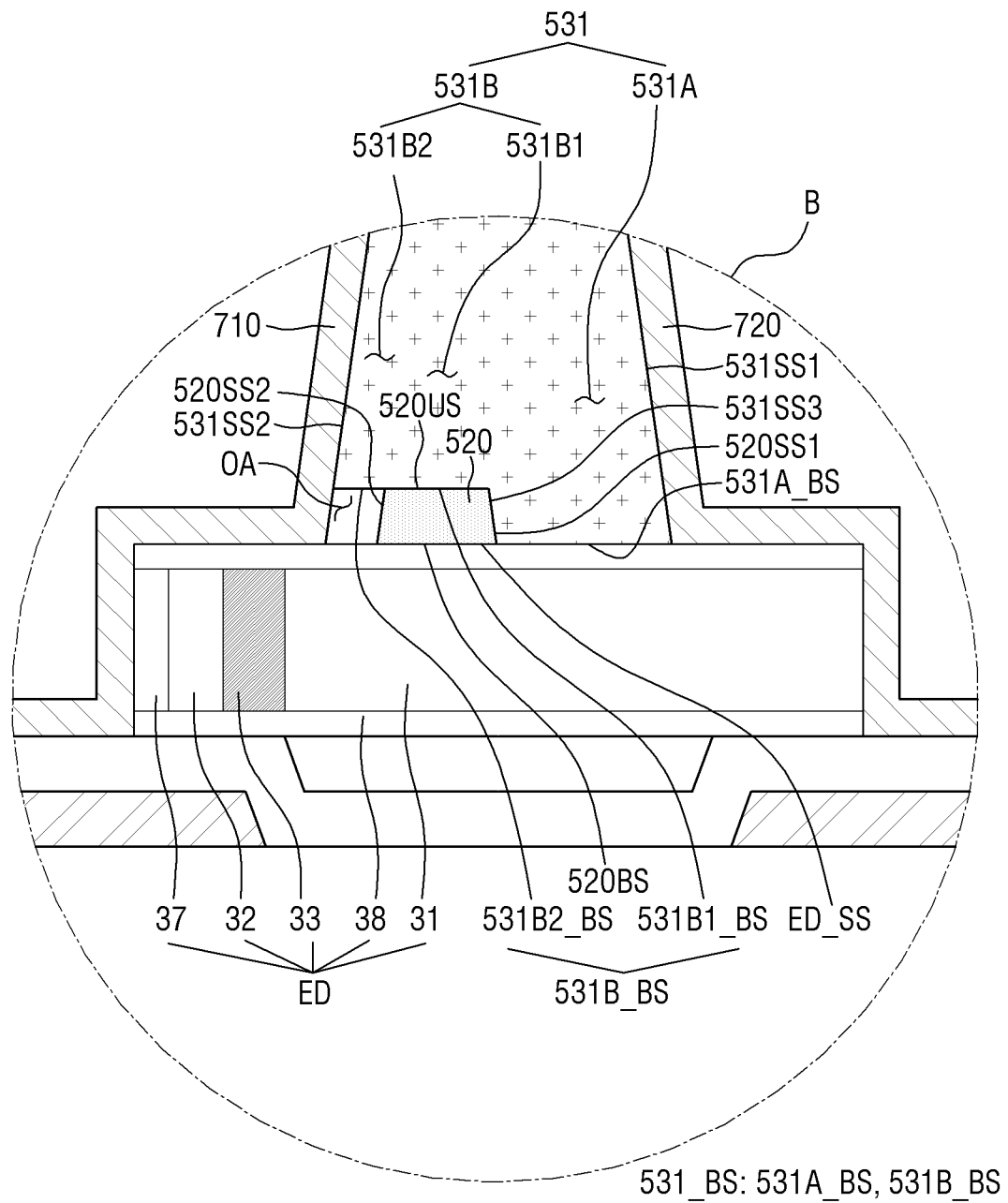
FIG. 7B is an enlarged cross-sectional view schematically illustrating an example of area B of FIG. 7A.

FIG. 7A is a schematic enlarged cross-sectional view illustrating an example of area A of FIG. 3. FIG. 7B is a schematic enlarged cross-sectional view illustrating an example of area B of FIG. 7A.

Referring to FIGS. 6, 7A and 7B, the light emitting element ED may extend in a direction parallel to the top surface of the substrate SUB. The semiconductor layers included in the light emitting element ED may be sequentially arranged in the direction parallel to the top surface of the substrate SUB. For example, the first semiconductor layer 31, the element active layer 33, and the second semiconductor layer 32 of the light emitting element ED may be sequentially arranged in the direction parallel to the top surface of the substrate SUB.

Specifically, in the light emitting element ED, the first semiconductor layer 31, the element active layer 33, the second semiconductor layer 32, and the element electrode layer 37 may be sequentially formed in the direction parallel to the top surface of the substrate SUB in a cross-sectional view across both ends of the light emitting element ED.

Hereinafter, in this specification, the end of the light emitting element ED where the first semiconductor layer 31 is located may be defined as a first end, and an opposite end (or the end where the second semiconductor layer 32 is located) may be defined as a second end.

The light emitting element ED may be disposed such that the first end is located on the first electrode 210 and the second end is located on the second electrode 220. However, the disclosure is not limited thereto, and the light emitting element ED may be disposed such that the first end is located on the second electrode 220 and the second end is located on the first electrode 210.

The second insulating layer 520 may be disposed on the light emitting element ED in the emission area EMA. The second insulating layer 520 may expose both ends of the light emitting element ED.

The width of the second insulating layer 520 in the first direction DR1 may be smaller than a width W1 of the fixing pattern 531 in the first direction DR1 and a length h of the light emitting element ED in the first direction DR1, for example, the extension direction of the light emitting element ED. Since the width of the second insulating layer 520 in the first direction DR1 is smaller than the length h of the light emitting element ED in the extension direction, the second insulating layer 520 may expose both the ends of the light emitting element ED.

The second insulating layer 520 may be directly disposed on an outer surface ED_SS of the light emitting element ED. The second insulating layer 520 may be directly disposed to surround the outer surface ED_SS of the light emitting element ED, and thus may serve to affix the light emitting element ED to the first insulating layer 510. Specifically, the second insulating layer 520 is patterned to completely cover (or overlap) the outer surface ED_SS of an end of the light emitting element ED and expose the outer surface ED_SS of another end of the light emitting element ED in the step of forming the fixing pattern 531 on the light emitting element ED in the manufacturing process of the display device 10 to be described below. Accordingly, it is possible to affix the light emitting element ED and prevent the separation of the light emitting element ED due to the material contained in the fixing pattern 531.

The second insulating layer 520 may include a top surface 520US, a bottom surface 520BS, a first side surface 520SS1, and a second side surface 520SS2. The bottom surface 520BS of the second insulating layer 520 may be directly disposed on the outer surface ED_SS of the light emitting element ED. In other words, the bottom surface 520BS of the second insulating layer 520 and the outer surface ED_SS of the light emitting element ED may contact each other. The first side surface 520SS1 of the second insulating layer 520 may contact a third side surface 531SS3 of the fixing pattern 531 that will be described below, and the top surface 520US of the second insulating layer 520 may contact at least a part of a bottom surface 531B_BS of a second region 531B of the fixing pattern 531 that will be described below. Further, the second side surface 520SS2 of the second insulating layer 520 may be aligned more inward than a second side surface 531SS2 of the fixing pattern 531.

The fixing pattern 531 of the third insulating layer 530 may be disposed on the light emitting element ED in the emission area EMA. The width W1 of the fixing pattern 531 in the first direction DR1 may be smaller than the length h of the light emitting element ED in the first direction DR1, for example, the extension direction of the light emitting element ED. Since the width W1 of the fixing pattern 531 is smaller than the length h of the light emitting element ED in the extension direction, the fixing pattern 531 may expose both ends of the light emitting element ED as described above.

The fixing pattern 531 may include a first region 531A contacting the outer surface ED_SS of the light emitting element ED and the second region 531B not contacting the outer surface ED_SS of the light emitting element ED. The second region 531B of the fixing pattern 531 may be disposed on the light emitting element ED while being spaced apart from the outer surface ED_SS of the light emitting element ED by a gap. A bottom surface 531_BS of the fixing pattern 531 may include a bottom surface 531A_BS of the first region 531A of the fixing pattern 531 and the bottom surface 531B_BS of the second region 531B of the fixing pattern 531.

The first region 531A of the fixing pattern 531 may be directly disposed on the outer surface ED_SS of the light emitting element ED. In other words, the bottom surface 531A_BS of the first region 531A of the fixing pattern 531 may contact the outer surface ED_SS of the light emitting element ED. Referring to FIG. 2, the fixing pattern 531 may extend in the second direction DR2 in a plan view to be directly disposed on the first insulating layer 510 where the light emitting element ED is exposed in the region between the light emitting elements ED spaced apart from each other in the second direction DR2. Since the first region 531A of the fixing pattern 531 is directly disposed to surround the first insulating layer 510 and the outer surface ED_SS of the light emitting element ED, the fixing pattern 531 may stably affix the light emitting element ED to the first insulating layer 510.

The second region 531B of the fixing pattern 531 may not be directly disposed on the outer surface ED_SS of the light emitting element ED. The second region 531B of the fixing pattern 531 may be disposed on the light emitting element ED while being spaced apart from the outer surface ED_SS of the light emitting element ED. In other words, the bottom surface 531B_BS of the second region 531B of the fixing pattern 531 may face the outer surface ED_SS of the light emitting element ED with a gap therebetween. The gap between the bottom surface 531B_BS of the second region 531B of the fixing pattern 531 and the outer surface ED_SS of the light emitting element ED may be equal to the thickness of the second insulating layer 520.

The second region 531B of the fixing pattern 531 may include a first portion 531B1 overlapping the second insulating layer 520 in the thickness direction of the substrate SUB, and a second portion 531B2 not overlapping the second insulating layer 520 in the thickness direction of the substrate SUB. In other words, the second region 531B of the fixing pattern 531 may include the first portion 531B1 where the second insulating layer 520 is interposed between the second region 531B of the fixing pattern 531 and the light emitting element ED, and the second portion 531B2 forming a separation space OA between the second region 531B of the fixing pattern 531 and the light emitting element ED.

The second insulating layer 520 may be interposed between the first portion 531B1 of the second region 531B of the fixing pattern 531 and the light emitting element ED. The second insulating layer 520 may be interposed between the first portion 531B1 of the second region 531B of the fixing pattern 531 and the light emitting element ED, and the fixing pattern 531 may be disposed to completely cover (or overlap) the top surface 520US and the first side surface 520SS1 of the second insulating layer 520. Therefore, a bottom surface 531B1_BS of the first portion 531B1 of the second region 531B of the fixing pattern 531 and the top surface 520US of the second insulating layer 520 may be disposed on the same plane and contact each other. Further, the bottom surface 520BS of the second insulating layer 520 may contact the outer surface ED_SS of the light emitting element ED while surrounding the outer surface ED_SS of the light emitting element ED.

The separation space OA may be formed between the second portion 531B2 of the second region 531B of the fixing pattern 531 and the light emitting element ED. The separation space OA may be formed by overetching a second insulating material pattern 520'' (see FIG. 11) interposed between the fixing pattern 531 and the light emitting element ED in the etching step of forming the second insulating layer 520.

The separation space OA may be defined as a region delimited by a bottom surface 531B2_BS of the second portion 531B2 of the second region 531B of the fixing pattern 531, the second side surface 520SS2 of the second insulating layer 520, and the outer surface ED_SS of the light emitting element ED. In the separation space OA, the bottom surface 531B2_BS of the second portion 531B2 of the second region 531B of the fixing pattern 531 and the outer surface ED_SS of the light emitting element ED may face each other with a gap corresponding to the thickness of the second insulating layer 520.

On the other hand, the fixing pattern 531 may include a first side surface 531SS1, a second side surface 531SS2, and a third side surface 531SS3. The first side surface 531SS1 of the fixing pattern 531 may be a side surface facing the second sub-bank 420, and the second side surface 531SS2 of the fixing pattern 531 may be a side surface facing the first sub-bank 410. The third side surface 531SS3 of the fixing pattern 531 may be a side surface that connects the bottom surface 531A_BS of the first region 531A of the fixing pattern 531 to the bottom surface 531B_BS of the second region 531B of the fixing pattern 531.

The second contact electrode 720 may be disposed on the first side surface 531SS1 of the fixing pattern 531. The second contact electrode 720 may contact the second end of the light emitting element ED. The second contact electrode 720 may be disposed on a part of the first side surface 531SS1 of the fixing pattern 531 while extending from the second end of the light emitting element ED.

The first contact electrode 710 may be disposed on the second side surface 531SS2 of the fixing pattern 531. The first contact electrode 710 may contact the first end of the light emitting element ED. The first contact electrode 710 may be disposed on a part of the second side surface 531SS2 of the fixing pattern 531 while extending from the first end of the light emitting element ED.

The second side surface 531SS2 of the fixing pattern 531 may not be aligned side by side with the second side surface 520SS2 of the second insulating layer 520. In other words, the second side surface 531SS2 of the fixing pattern 531 may protrude more outward from the second side surface 520SS2 of the second insulating layer 520.

The first contact electrode 710 and the second contact electrode 720 may not contact the second insulating layer 520. Specifically, the second side surface 531SS2 of the fixing pattern 531 on which the first contact electrode 710 is disposed may protrude more outward than the second side surface 520SS2 of the second insulating layer 520. Accordingly, the separation space OA may be formed between the first contact electrode 710 and the second insulating layer 520. Further, the second contact electrode 720 is disposed on the first side surface 531SS1 of the fixing pattern 531, so that the fixing pattern 531 may be interposed between the second contact electrode 720 and the second insulating layer 520. Therefore, the separation space OA is formed between the first contact electrode 710 and the second insulating layer 520, and the fixing pattern 531 is interposed between the second contact electrode 720 and the second insulating layer 520. Accordingly, the first and second contact electrodes 710 and 720 and the second insulating layer 520 may not contact each other.

The third side surface 531SS3 of the fixing pattern 531 may contact the first side surface 520SS1 of the second insulating layer 520. Since the fixing pattern 531 is formed on the second insulating layer 520, the third side surface 531SS3 of the fixing pattern 531 may coincide with the first side surface 520SS1 of the second insulating layer 520.

In accordance with the display device 10 according to the embodiment, the third insulating layer 530 containing an organic insulating material may be formed on the second insulating layer 520 containing an inorganic insulating material. The third insulating layer 530 may serve to affix the light emitting element ED on the first insulating layer 510 to prevent the separation of the light emitting element ED. The third insulating layer 530 of the display device 10 according to the embodiment may be formed in the sub-region SA as well as the emission area EMA to stably affix the light emitting element ED. Since the third insulating layer 530 is formed in the emission area EMA and the sub-region SA, the third insulating layer 530 disposed on the light emitting element ED may stably affix the light emitting element ED on the first insulating layer 510.

Further, the third insulating layer 530 may contain an organic insulating material. In the case of forming the third insulating layer 530 containing the organic insulating material immediately after the step of aligning the light emitting element ED, the light emitting element ED aligned on the first insulating layer 510 may be separated by the organic insulating material. Therefore, it is possible to affix the light emitting element ED by forming the second insulating layer 520 containing an inorganic insulating material before the step of forming the third insulating layer 530. On the other hand, a part of the second insulating layer 520 may be damaged in the step of etching the second insulating layer 520 to expose both ends of the light emitting element ED. Even if a part of the second insulating layer 520 is damaged in the etching step of forming the second insulating layer 520, at least a part of the fixing pattern 531 is formed to contact the light emitting element ED, and thus the light emitting element ED may be stably fixed on the first insulating layer 510 by the third insulating layer 530. Therefore, because of the direct contact between the third insulating layer 530 and the light emitting element ED, the peeling off of the fixing pattern 531 is prevented and the separation of the light emitting element ED is prevented. Accordingly, it is possible to improve the display quality of the display device 10.

FIGS. 8 to 12 are schematic cross-sectional views illustrating parts of the manufacturing process of a display device according to an embodiment.

Figure 8:
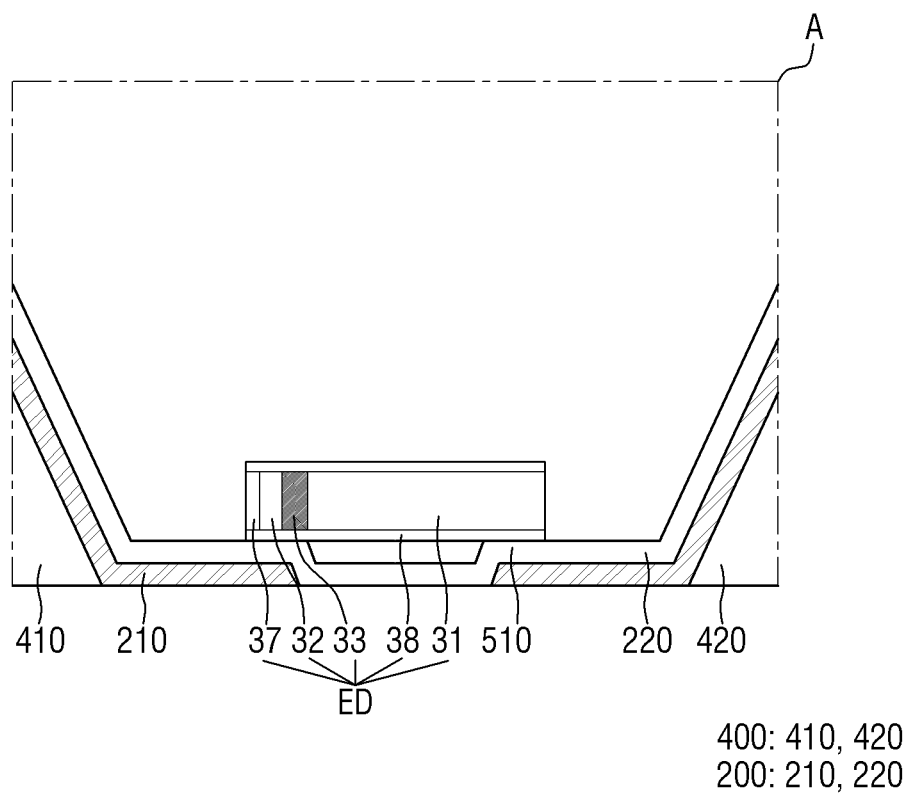
FIGS. 8 to 12 are schematic cross-sectional views illustrating parts of the manufacturing process of a display device according to an embodiment.

First, referring to FIG. 8, the first electrode 210 and the second electrode 220 are formed on the first sub-bank 410 and the second sub-bank 420, respectively. Then, the first insulating layer 510 is formed on the first electrode 210 and the second electrode 220. Then, the light emitting element ED is disposed on the first insulating layer 510 such that both ends thereof are located on the first electrode 210 and the second electrode 220, respectively. In the step of aligning the light emitting element ED, the light emitting element ED may be aligned using the first electrode 210 and the second electrode 220 such that both ends of the light emitting element ED are located on the first electrode 210 and the second electrode 220, respectively, in the separation space between the first sub-bank 410 and the second sub-bank 410 as shown in FIG. 8.

Figure 9:
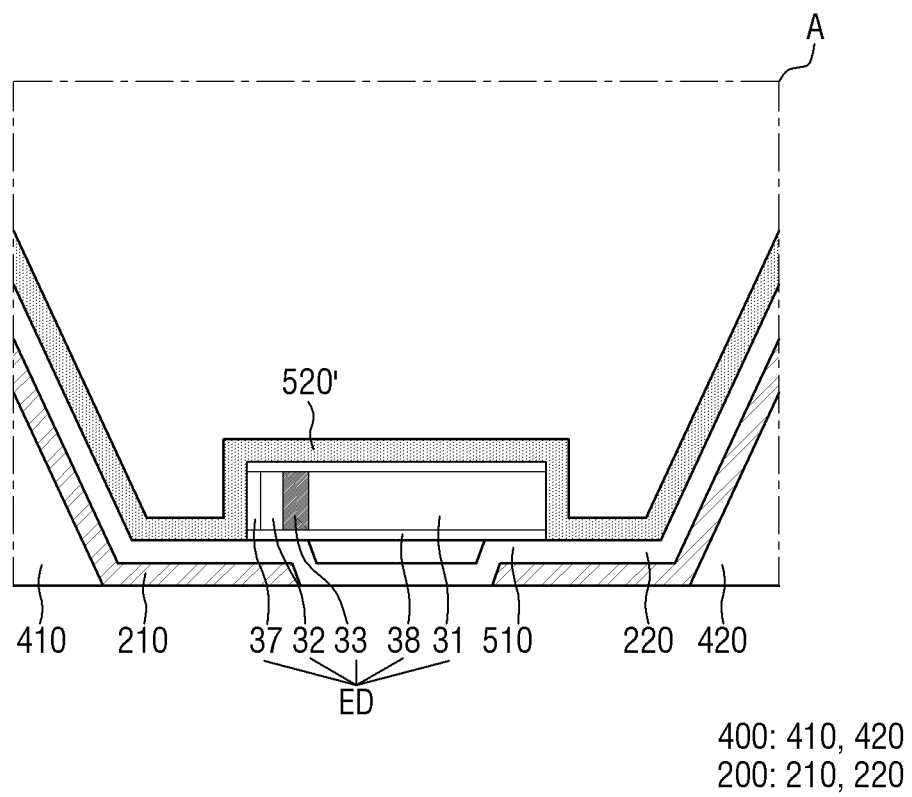
Figure 10:
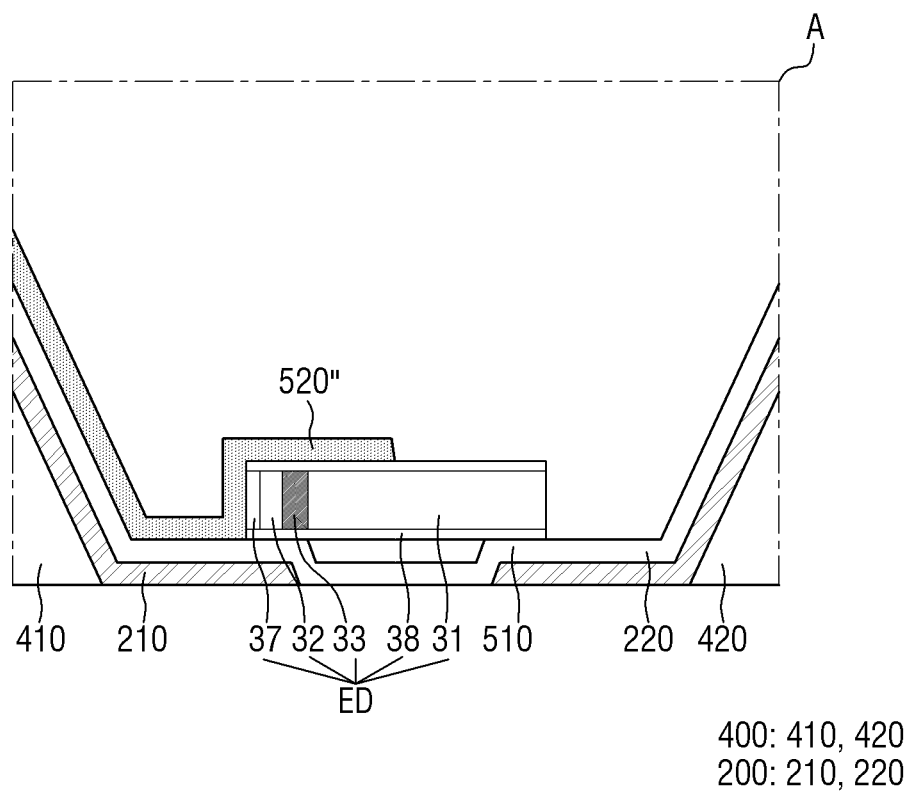

Then, referring to FIGS. 9 and 10, the second insulating material pattern 520" that covers (or overlaps) an end of the light emitting element ED and exposes another end of the light emitting element ED is formed. The step of forming the patterned second insulating material pattern 520" that covers the end of the light emitting element ED and exposes the other end of the light emitting element ED may include a step of completely coating (or applying) a second insulating material layer 520' on the light emitting element ED and the first insulating layer 510 where the light emitting element ED is exposed, and a step of forming the patterned second insulating material pattern 520" by removing a part of the second insulating material layer 520' such that the end of the light emitting element ED is covered and the other end of the light emitting element ED is exposed.

Specifically, the second insulating material pattern 520" may cover (or overlap) the end of the light emitting element ED and expose the other end of the light emitting element ED. The second insulating material pattern 520" may be disposed to cover the end of the light emitting element ED and may extend outward to be disposed on the electrode (e.g., first and second electrodes 210 and 220) and the sub-bank (e.g., first and second sub-banks 410 and 420). The second insulating material layer 520' and the second insulating material pattern 520" may be the material layer corresponding to the above-described second insulating layer 520. For example, the second insulating material pattern 520" may be disposed to cover the first end of the light emitting element ED and may extend outward to be disposed on the first electrode 210 and the first sub-bank 410. Since the second insulating material pattern 520" is disposed to cover the end of the light emitting element ED, the light emitting element ED may be fixed to the first insulating layer 510 by the second insulating material pattern 520" even though the other end of the light emitting element ED is exposed. Further, since the second insulating material pattern 520" is disposed to cover (or overlap) the end of the light emitting element ED and expose the other end of the light emitting element ED, the third insulating layer 530 may be formed such that at least a part of the fixing pattern 531 of the third insulating layer 530 contacts the outer surface of the light emitting element ED.

Since the second insulating material pattern 520" contains an inorganic insulating material, the light emitting element ED may be stably fixed on the first insulating layer 510 without being separated therefrom in the step of forming the second insulating material pattern 520". On the other hand, the width of the second insulating material pattern 520" overlapping the light emitting element ED in the third direction DR3 may be adjusted within a range in which the second insulating material pattern 520" stably affixes the light emitting element ED.

Figure 11:
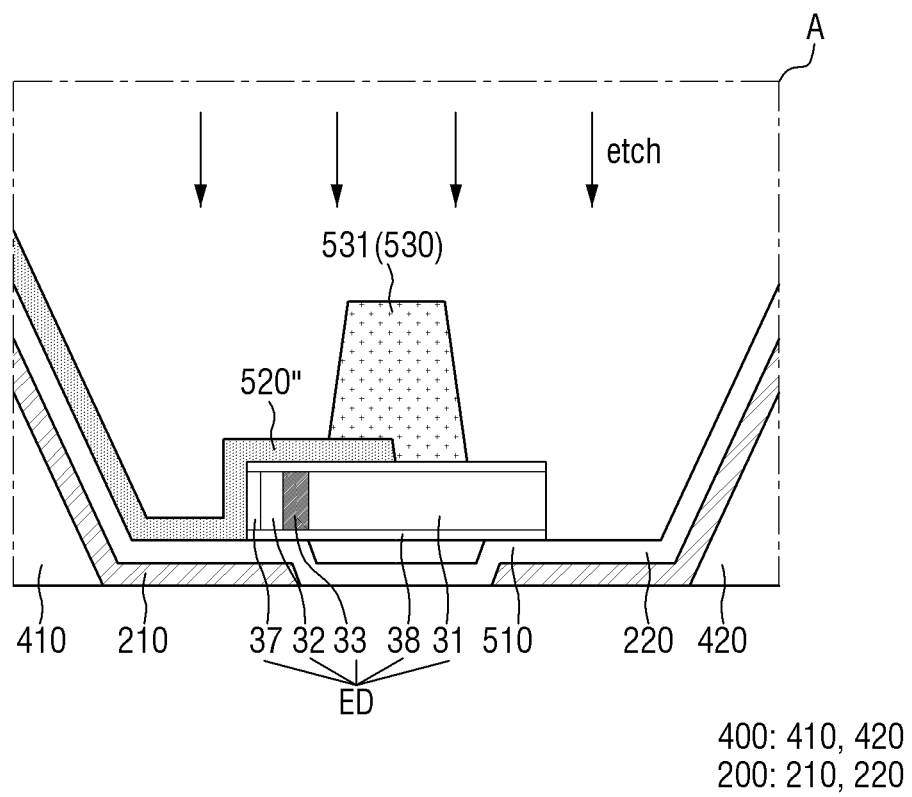

Then, referring to FIG. 11, the patterned third insulating layer 530 is formed on the second insulating material pattern 520". Since the second insulating material pattern 520" is formed to cover (or overlap) a part of the light emitting element ED and expose another part of the light emitting element ED, at least a part of the third insulating layer 530 may be formed to contact the outer surface of the light emitting element ED.

As described above, the third insulating layer 530 may include the fixing pattern 531, the support pattern portion 532, and the first connection portion 533. The fixing pattern 531, the support pattern portion 532, and the first connection portion 533 may be integral with each other by one step. As described above, the third insulating layer 530 may contain an organic insulating material and may be formed by completely coating (or applying) the organic insulating material on the light emitting element ED, the second insulating material 520", and the first insulating layer 510 and then removing a part of the inorganic insulating material. In this step, the light emitting element ED is fixed on the first insulating layer 510 by the second insulating material pattern 520" that completely covers (or overlaps) the end of the light emitting element ED, so that it is possible to prevent the separation of the light emitting element ED even though the third insulating layer 530 contains an organic insulating material.

For example, the patterned third insulating layer 530 may be formed using a mask. Specifically, a third insulating layer material layer is completely coated (or applied) on the second insulating material pattern 520", the light emitting element ED, and the first insulating layer 510. Then, a patterned etching mask is formed on the third insulating layer material layer. The third insulating layer material layer may be etched using the etching mask to form the patterned third insulating layer 530 as shown in FIG. 11. The step of etching the third insulating layer material layer may be performed by dry etching. However, the disclosure is not limited thereto, and the patterned third insulating layer 530 may be formed by coating (or applying) the third insulating layer material layer and then performing exposure and development.

Figure 12:
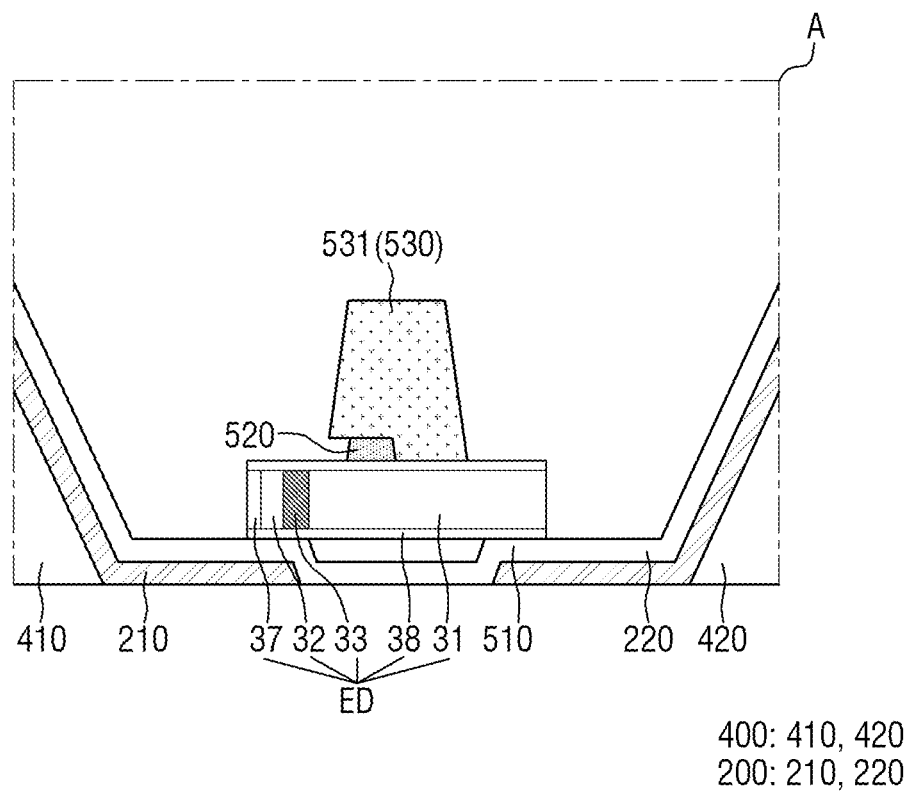

Then, referring to FIGS. 11 and 12, a part of the second insulating material pattern 520" is removed to expose the end of the light emitting element ED. The step of removing a part of the second insulating material pattern 520" may be performed by the etching step using the etching mask remaining on the third insulating layer 530. The etching step may be, but not necessarily, performed by dry etching. In the etching step, the second insulating material pattern 520" overlapping the third insulating layer 530 and the etching mask may remain, and the second insulating material pattern 520" that does not overlap the third insulating layer 530 and the etching mask may be removed.

On the other hand, in the step of forming the second insulating layer 520 by removing a part of the second insulating material pattern 520" to expose the end of the light emitting element ED, it is required to overetch the second insulating material pattern 520" in order to completely remove the second insulating material pattern 520" disposed on the first electrode 210 and the end of the light emitting element ED. Therefore, in this etching step, the second insulating material pattern 520" is overetched, so that the second side surface 520SS2 of the second insulating layer 520 may be aligned more inward than the second side surface 531SS2 of the fixing pattern 531 of the third insulating layer 530 as shown in FIG. 12.

Since the second insulating material pattern 520" is overetched, a part of the second insulating layer 520 may be damaged. Although a part of the second insulating layer 520 is damaged, it is possible to prevent the separation of the light emitting element ED because a part of the fixing pattern 531 (specifically, the first region 531A of the fixing pattern 531) is directly disposed on the outer surface ED_SS of the light emitting element ED and affixes the light emitting element ED.

The contact electrode 700 is formed on the third insulating layer 530 so that the display device 10 shown in FIG. 7A is manufactured. The contact electrode 700 may include the first contact electrode 710 and the second contact electrode 720 spaced apart from each other that are formed by completely coating (or applying) a contact electrode material layer on the light emitting element ED and the third insulating layer 530 and then removing a part of the contact electrode material layer.

Figure 13:
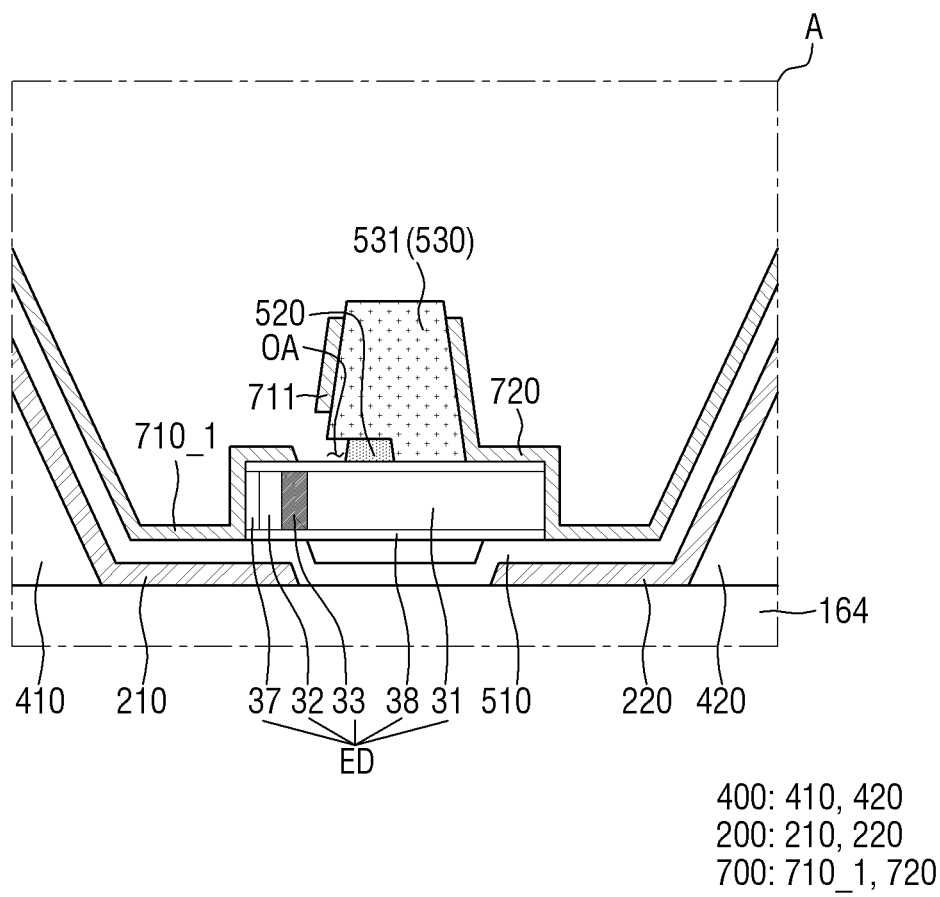
FIG. 13 is an enlarged cross-sectional view schematically illustrating another example of area A of FIG. 3.

FIG. 13 is a schematic enlarged cross-sectional view illustrating another example of area A of FIG. 3.

Referring to FIG. 13, the display device 10 according to the embodiment is different from the embodiment of FIG. 7A at least in that a first contact electrode 710_1 is disposed to cover (or overlap) the first end of the light emitting element ED and extends from the first end of the light emitting element ED without being disposed on the side surface of the fixing pattern 531.

Specifically, the first contact electrode 710_1 may cover (or overlap) the first end of the light emitting element ED but may not be disposed on the second side surface 531SS2 of the fixing pattern 531. A first pattern 711 may be disposed on the second side surface 531SS2 of the fixing pattern 531. The first pattern 711 and the first contact electrode 710_1 may contain a same material and may be spaced apart from each other. As described above, the structure in which the first contact electrode 710_1 and the first pattern 711 are electrically disconnected from each other may be formed in the step of forming the contact electrode 700. Specifically, in the step of forming the contact electrode 700 by completely coating (or applying) the contact electrode material layer on the light emitting element ED and the third insulating layer 530, the contact electrode material layer may be electrically disconnected in the separation space OA formed between the fixing pattern 531 and the light emitting element ED without being completely coated (or applied) thereon because of the separation space OA. Thus, the first pattern 711 and the first contact electrode 710_1 that are spaced apart from each other as shown in FIG. 13 may be formed.

In the embodiment, in the patterning step of forming the first contact electrode 710_1 and the second contact electrode 720 spaced apart from each other, the first contact electrode 710_1 and the second contact electrode 720 may be easily spaced apart from each other because of the separation space OA. Therefore, the manufacturing efficiency of the display device 10 may be improved.

Figure 14:
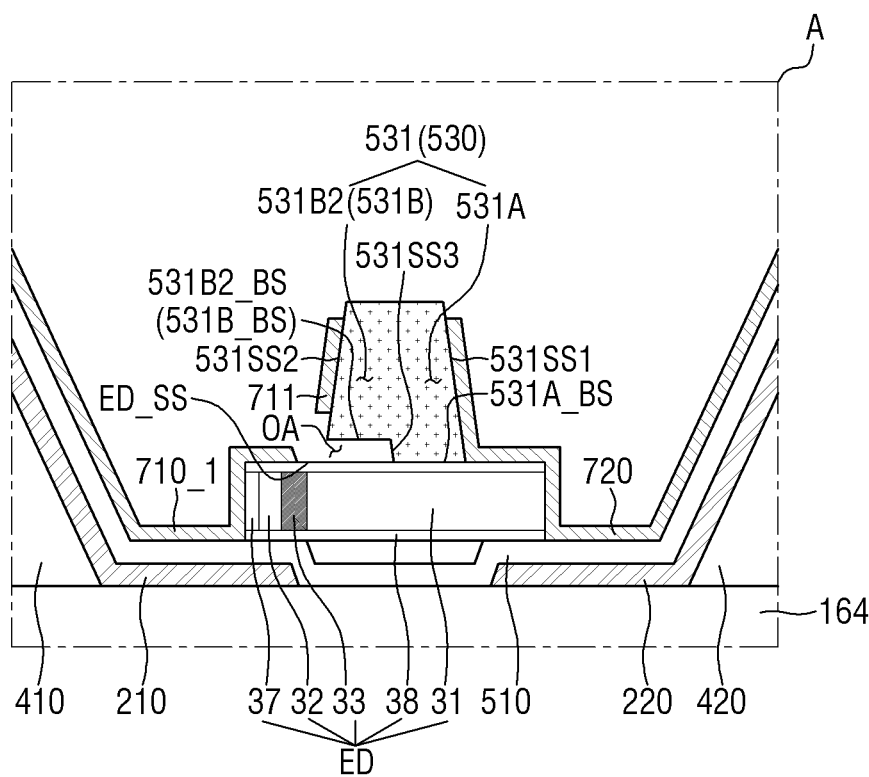
FIG. 14 is an enlarged cross-sectional view schematically illustrating still another example of area A of FIG. 3.

FIG. 14 is a schematic enlarged cross-sectional view illustrating still another example of area A of FIG. 3.

Referring to FIG. 14, the display device 10 according to the embodiment is different from the embodiment shown in FIG. 13 at least in that the second region 531B of the fixing pattern 531 is the same as the second portion 531B2 of the second region 531B of the fixing pattern 531.

Specifically, in the embodiment, the second insulating layer 520 may not be disposed between the second region 531B of the fixing pattern 531 and the light emitting element ED. Therefore, the bottom surface 531B_BS of the second region 531B of the fixing pattern 531 and the bottom surface 531B2_BS of the second portion 531B2 of the second region 531B of the fixing pattern 531 may be the same. Further, the bottom surface 531B_BS of the second region 531B of the fixing pattern 531 may face the outer surface ED_SS of the light emitting element ED with a predetermined distance therebetween.

In the embodiment, the second insulating layer 520 may be omitted. As described with reference to FIG. 11, in the step of etching the second insulating material pattern 520", the second material pattern 520" may be overetched to expose the first end of the light emitting element ED. Because of the overetching, the second insulating material pattern 520" disposed below the second region 531B of the third insulating layer 530 is completely removed, so that the display device 10 shown in FIG. 14 may be manufactured. On the other hand, although the second insulating material pattern 520" is completely removed, the light emitting element ED may be fixed on the first insulating layer 510 by the fixing pattern 531.

Figure 15:
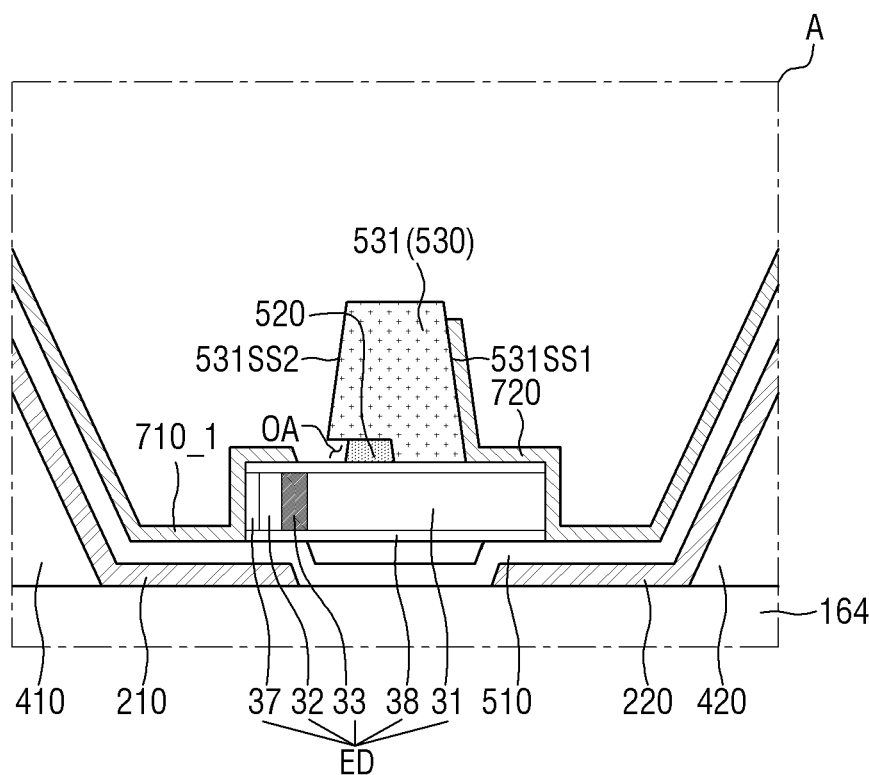
FIG. 15 is an enlarged cross-sectional view schematically illustrating still another example of area A of FIG. 3.

FIG. 15 is a schematic enlarged cross-sectional view illustrating still another example of area A of FIG. 3.

Referring to FIG. 15, the display device 10 according to the embodiment is different from the embodiment of FIG. 13 at least in that the side surface 531SS2 of the fixing pattern 531 is exposed without the first contact electrode 710_1 or the first pattern 711 disposed thereon.

In the embodiment, in the step of forming the contact electrode 700 by completely coating (or applying) the contact electrode material layer, the contact electrode material layer may not be formed on the second side surface 531SS2 of the fixing pattern 531 because of the separation space OA. In case that the contact electrode material layer is not formed on the second side surface 531SS2 of the fixing pattern 531 because of the separation space OA, the step of disconnecting the first contact electrode 710 from the second contact electrode 720 becomes easy, and thus the efficiency of the manufacturing process of the display device 10 may be improved.

Figure 16:
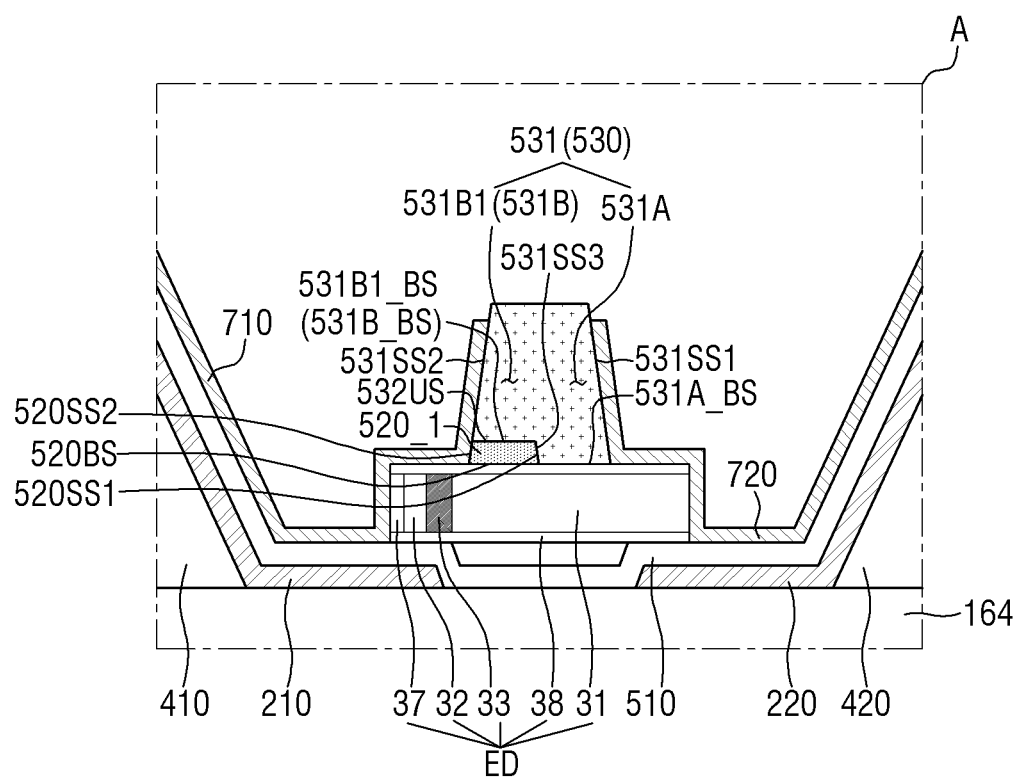
FIG. 16 is an enlarged cross-sectional view schematically illustrating still another example of area A of FIG. 3.

FIG. 16 is a schematic enlarged cross-sectional view illustrating still another example of area A of FIG. 3.

Referring to FIG. 16, the display device 10 according to the embodiment is different from the embodiment of FIG. 7A at least in that a second side surface 520SS2 of a second insulating layer 520_1 is aligned side by side with the second side surface 531SS2 of the fixing pattern 531.

Specifically, the second insulating layer 520_1 may be interposed between the second region 531B of the fixing pattern 531 and the light emitting element ED. The second region 531B of the fixing pattern 531 may completely overlap the second insulating layer 520_1 in the thickness direction of the substrate SUB. The width of the second region 531B of the fixing pattern 531 in the first direction DR1 may be equal to the width of the second insulating layer 520_1 in the first direction DR1. Therefore, in the embodiment, the second region 531B of the fixing pattern 531 may be the same as the first portion 531B1 of the second region 531B of the fixing pattern 531.

The bottom surface 531B_BS of the second region 531B of the fixing pattern 531 may contact the top surface 520US of the second insulating layer 520_1. The width of the bottom surface 531B_BS of the second region 531B of the fixing pattern 531 may be equal to the width of the top surface 520US of the second insulating layer 520_1. Therefore, the second side surface 531SS2 of the fixing pattern 531 may be aligned side by side with the second side surface 520SS2 of the second insulating layer 520_1.

Therefore, the first contact electrode 710 may be directly disposed on the first end of the light emitting element ED, the second side surface 520SS2 of the second insulating layer 520_1, and the second side surface 531SS2 of the fixing pattern 531. The first contact electrode 710 may be directly disposed on the first end of the light emitting element ED, the second side surface 520SS2 of the second insulating layer 520_1, and the second side surface 531SS2 of the fixing pattern 531.

Figure 17:
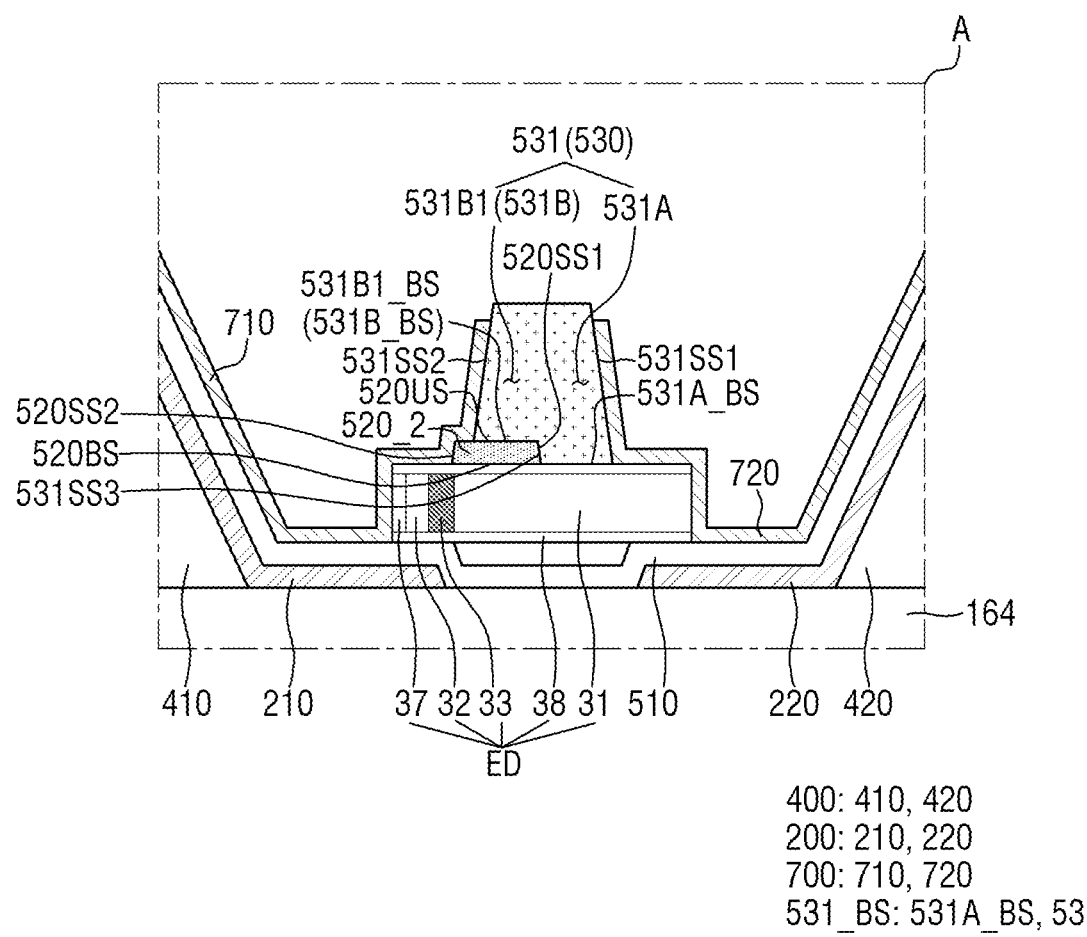
FIG. 17 is an enlarged cross-sectional view schematically illustrating still another example of area A of FIG. 3.

FIG. 17 is a schematic enlarged cross-sectional view illustrating still another example of area A of FIG. 3.

Referring to FIG. 17, the display device 10 according to the embodiment is different from the embodiment shown in FIG. 16 at least in that a second side surface 520SS2 of a second insulating layer 520_2 protrudes more outward than the second side surface 531SS2 of the fixing pattern 531.

Specifically, the second insulating layer 520_2 may be interposed between the second region 531B of the fixing pattern 531 and the light emitting element ED. The second region 531B of the fixing pattern 531 may completely overlap the second insulating layer 520_2 in the thickness direction of and the substrate SUB. The width of the second region 531B of the fixing pattern 531 in the first direction DR1 may be smaller than the width of the second insulating layer 520_2 in the first direction DR1. Therefore, in the embodiment, the second region 531B of the fixing pattern 531 may be the same as the first portion 531B1 of the second region 531B of the fixing pattern 531.

The bottom surface 531B_BS of the second region 531B of the fixing pattern 531 may contact a part of the top surface 520US of the second insulating layer 520_2. The width of the bottom surface 531B_BS of the second region 531B of the fixing pattern 531 may be smaller than the width of the top surface 520US of the second insulating layer 520_2. Therefore, the second side surface 520SS2 of the second insulating layer 520_2 may protrude more outward than the second side surface 531SS2 of the fixing pattern 531. In other words, the fixing pattern 531 may expose a part of the top surface 520US of the second insulating layer 520_2 in the third direction DR3.

Therefore, the first contact electrode 710 may be directly disposed on the first end of the light emitting element ED, the second side surface 520SS2 of the second insulating layer 520_2, the top surface 520US of the second insulating layer 520_2 where the fixing pattern 531 is exposed, and the second side surface 531SS2 of the fixing pattern 531. The first contact electrode 710 may be directly disposed on the first end of the light emitting element ED, the second side surface 520SS2 of the second insulating layer 520_2, the top surface 520US of the second insulating layer 520_2 where the fixing pattern 531 is exposed, and the second side surface 531SS2 of the fixing pattern 531.

In the embodiment, the width of the etching mask used in the etching step of forming the second insulating layer 520_2 may be greater than the width of the fixing pattern 531, or the etching for removing a part of the second insulating material pattern 520" may not be sufficiently performed. The first contact electrode 710 and the second contact electrode 720 spaced apart from each other in the first direction DR1 may be formed by the step of disconnecting the first contact electrode 710 from the second contact electrode 720.

Figure 18:
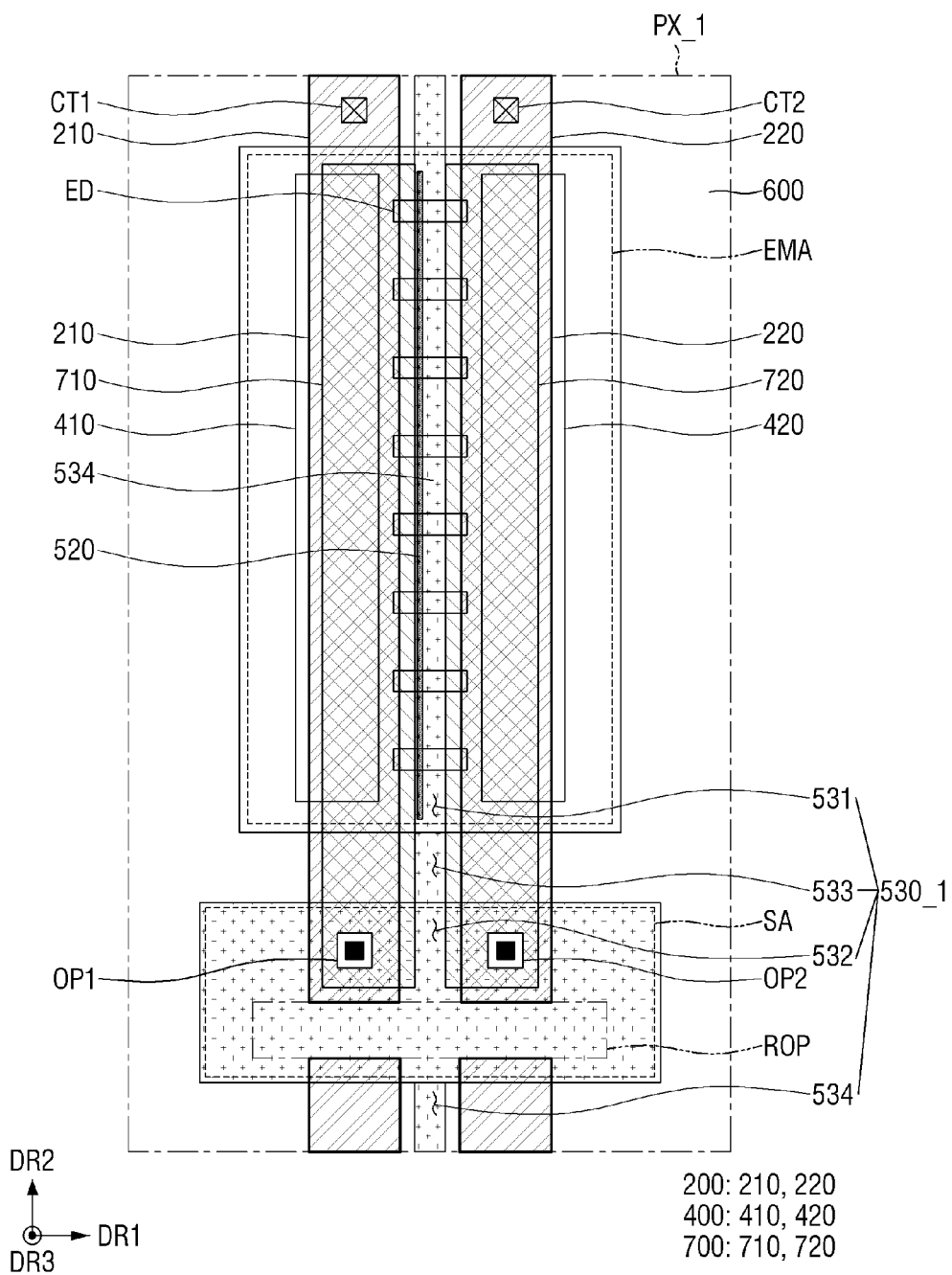
FIG. 18 is a schematic plan view illustrating one pixel of a display device according to another embodiment.

FIG. 18 is a schematic plan view illustrating a pixel of a display device according to another embodiment.

Referring to FIG. 18, the display device 10 according to the embodiment is different form the embodiment of FIG. 2 at least in that a third insulating layer 530_1 in a pixel PX_1 is connected to another third insulating layer 530_1 in another pixel PX_1 adjacent thereto in the second direction DR2.

Specifically, the third insulating layer 530_1 may further include a second connection portion 534. The second connection portion 534 may be disposed between the emission area EMA and the sub-region SA of another pixel PX_1 adjacent thereto in the second direction DR2. The second connection portion 534 may be disposed between the fixing pattern 531 disposed in the emission area EMA of a pixel PX_1 and the support pattern portion 532 disposed in the sub-region SA of another pixel PX_1 adjacent thereto in the second direction DR2 to connect the third insulating layers 530_1. The third insulating layers 530_1 in pixels PX_1 located in a same column may be integral with each other as one pattern by the second connection portion 534.

Since the third insulating layers 530_1 in the pixels PX_1 located in the same column are integral with each other as one pattern, the third insulating layer 530_1 may be stably fixed on the light emitting element ED and the first insulating layer 510 to affix the light emitting element ED.

In concluding the detailed description, those skilled in the art will appreciate that many variations and modifications can be made to the embodiments without substantially departing from the principles of the disclosure. Therefore, the disclosed embodiments of the discloses are used in a generic and descriptive sense only and not for purposes of limitation.

What is claimed is:

1. A display device comprising:
a substrate including an emission area and a sub-region;
a first electrode and a second electrode disposed in the emission area and the sub-region on the substrate and spaced apart from each other in a first direction;
a first insulating layer disposed on the first electrode and the second electrode;
at least one light emitting element disposed on the first insulating layer in the emission area, and including ends disposed on the first electrode and the second electrode, respectively; and
a second insulating layer disposed on the first insulating layer, wherein
the second insulating layer includes:
a fixing pattern disposed on the at least one light emitting element in the emission area;
a support pattern portion disposed on the first insulating layer in the sub-region; and
a connection portion disposed between the fixing pattern and the support pattern portion and connecting the fixing pattern and the support pattern portion, and
the fixing pattern includes:
a first region that contacts an outer surface of the at least one light emitting element; and
a second region that does not contact the outer surface of the at least one light emitting element.

2. The display device of claim 1, wherein a width of the fixing pattern in the first direction is smaller than a length of the at least one light emitting element in the first direction.

3. The display device of claim 2, wherein the fixing pattern exposes the ends of the at least one light emitting element.

4. The display device of claim 2, wherein a width of the support pattern portion in the first direction is greater than the width of the fixing pattern in the first direction.

5. The display device of claim 2, wherein
each of the first electrode, the second electrode, and the fixing pattern extends in a second direction intersecting the first direction, and
a length of the fixing pattern in the second direction is greater than the width of the fixing pattern in the first direction.

6. The display device of claim 1, further comprising a first bank that delimits the emission area and the sub-region,
wherein the connection portion is disposed on the first bank disposed between the emission area and the sub-region.

7. The display device of claim 6, wherein the support pattern portion is disposed on an entire surface of the sub-region and overlaps at least a part of a side surface of the first bank disposed between the emission area and the sub-region.

8. The display device of claim 7, wherein a height of the support pattern portion is lower than a height of the first bank.

9. The display device of claim 1, wherein
a bottom surface of the first region of the fixing pattern surrounds the outer surface of the at least one light emitting element, and
a bottom surface of the second region of the fixing pattern faces and is spaced apart from the outer surface of the at least one light emitting element.

10. The display device of claim 9, further comprising a third insulating layer interposed between at least a part of the second region of the fixing pattern and the at least one light emitting element,
wherein a gap between the bottom surface of the second region of the fixing pattern and the outer surface of the at least one light emitting element is equal to a thickness of the third insulating layer.

11. The display device of claim 1, further comprising a third insulating layer disposed between the second region of the fixing pattern and the at least one light emitting element.

12. The display device of claim 11, wherein
the second insulating layer includes an organic insulating material, and
the third insulating layer includes a material different from a material included in the second insulating layer.

13. The display device of claim 12, wherein the third insulating layer includes an inorganic insulating material.

14. The display device of claim 11, wherein the fixing pattern overlaps a side surface and at least a part of a top surface of the third insulating layer, and exposes another side surface opposite to the side surface of the third insulating layer.

15. The display device of claim 14, wherein a width of the second region of the fixing pattern in the first direction is greater than a width of the third insulating layer in the first direction.

16. The display device of claim 15, wherein the second region of the fixing pattern includes:
a first portion overlapping the third insulating layer; and
a second portion not overlapping the third insulating layer.

17. The display device of claim 15, wherein the another side surface of the third insulating layer is aligned more inward than a side surface of the second region of the fixing pattern.

18. The display device of claim 14, wherein a width of the second region of the fixing pattern in the first direction is equal to a width of the third insulating layer in the first direction.

19. The display device of claim 14, wherein a width of the second region of the fixing pattern in the first direction is smaller than a width of the third insulating layer in the first direction.

20. The display device of claim 1, further comprising:
a first contact electrode disposed on the first electrode and contacting the first electrode and the at least one light emitting element; and
a second contact electrode disposed on the second electrode and contacting the second electrode and the at least one light emitting element,
wherein the first contact electrode and the second contact electrode are spaced apart from each other.

21. The display device of claim 20, wherein
the first contact electrode and the second contact electrode are disposed in the emission area and the sub-region, and
the first contact electrode and the second contact electrode are disposed on the support pattern portion in the sub-region.

22. The display device of claim 20, wherein the fixing pattern is disposed between the first contact electrode and the second contact electrode in the emission area.

23. The display device of claim 22, wherein at least one of the first contact electrode and the second contact electrode is disposed on a side surface of the fixing pattern in the emission area.

* * * * *